US008772067B2

(12) United States Patent
Nakayama et al.

(10) Patent No.: US 8,772,067 B2
(45) Date of Patent: Jul. 8, 2014

(54) SILICON SUBSTRATE HAVING TEXTURED SURFACE, SOLAR CELL HAVING SAME, AND METHOD FOR PRODUCING SAME

(75) Inventors: Ichiro Nakayama, Osaka (JP); Tsuyoshi Nomura, Kyoto (JP); Tomohiro Okumura, Osaka (JP); Mitsuo Saitoh, Osaka (JP); Hiroshi Tanabe, Nara (JP); Yukiya Usui, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/823,470

(22) PCT Filed: Apr. 13, 2012

(86) PCT No.: PCT/JP2012/002576
§ 371 (c)(1),
(2), (4) Date: Mar. 14, 2013

(87) PCT Pub. No.: WO2012/140906
PCT Pub. Date: Oct. 18, 2012

(65) Prior Publication Data
US 2013/0183791 A1 Jul. 18, 2013

(30) Foreign Application Priority Data

Apr. 15, 2011 (JP) .................. 2011-091374
Apr. 15, 2011 (JP) .................. 2011-091382
Apr. 15, 2011 (JP) .................. 2011-091386

(51) Int. Cl.
*H01L 21/00* (2006.01)
*H01L 31/0224* (2006.01)
*H01L 31/18* (2006.01)
*H01L 31/0236* (2006.01)
*H01L 31/068* (2012.01)

(52) U.S. Cl.
CPC .... *H01L 31/1804* (2013.01); *H01L 31/022458* (2013.01); *H01L 31/1892* (2013.01); *H01L 31/02363* (2013.01); *H01L 31/068* (2013.01); *Y02E 10/547* (2013.01); *H01L 31/02245* (2013.01)
USPC .. 438/57; 438/458; 257/E21.032; 257/E31.04

(58) Field of Classification Search
CPC .................. H01L 31/02021; H01L 31/022425
USPC ........................ 83/15, 170; 438/57, 458, 795; 257/E21.032, E31.04; 136/257, 259
See application file for complete search history.

(56) References Cited

U.S. PATENT DOCUMENTS 6,313,397 B1   11/2001   Washio et al.
2005/0126627 A1   6/2005   Hayashida (Continued)

FOREIGN PATENT DOCUMENTS

JP   04-223378 A   8/1992
JP   09-331077 A   12/1997

(Continued)

OTHER PUBLICATIONS

Ichiro Ikeda, "High Efficiency Multi Crystalline Silicon Back Contact Photovoltaic Solar Cell" academic journal of the Japan Institute of Electronics Packaging vol. 12 No. 6 (2009) p. 485.

(Continued)

*Primary Examiner* — Mark A Laurenzi
(74) *Attorney, Agent, or Firm* — Pearne & Gordon LLP

(57) ABSTRACT

The purpose of the present invention is to obtain a finer texture for a silicon substrate having a textured surface and thereby obtain a thinner silicon substrate for a solar cell. The invention provides a silicon substrate that has a thickness of 50 [mu]m or less and substrate surface orientation (111), and that has a textured surface on which a texture has been formed. Such a silicon substrate is produced by a process comprising a step (A) for preparing a silicon substrate that preferably has a thickness of 50 [mu]m or less and substrate surface orientation (111), and a step (B) for texturing by blowing etching as comprising a fluorine-containing gas onto the surface of the prepared silicon substrate.

30 Claims, 12 Drawing Sheets

(56) References Cited

U.S. PATENT DOCUMENTS

2009/0142874 A1  6/2009  Arai
2009/0277314 A1  11/2009  Henley
2010/0136735 A1  6/2010  Arai

FOREIGN PATENT DOCUMENTS

| JP | 10-313128 A | 11/1998 |
| JP | 2000-150937 A | 5/2000 |
| JP | 2003-017723 A | 1/2003 |
| JP | 2005-150614 A | 6/2005 |
| JP | 2009-152569 A | 7/2009 |
| JP | 2009-295973 A | 12/2009 |
| JP | 2010-034155 A | 2/2010 |
| JP | 2011-077370 A | 4/2011 |

OTHER PUBLICATIONS

International Search Report for PCT/JP2012/002576 dated Jul. 10, 2012.

SILICON SUBSTRATE HAVING TEXTURED SURFACE, SOLAR CELL HAVING SAME, AND METHOD FOR PRODUCING SAME

TECHNICAL FIELD

The present invention relates to a silicon substrate having a textured surface, a solar cell having the same, and a method of manufacturing the same.

BACKGROUND ART

In silicon solar cells (photoelectric conversion apparatuses) and the like, irregularities called a texture are provided in a light-receiving surface of a silicon substrate in order to suppress reflection of incident light and in order for the light taken-in by the silicon substrate not to be leaked to the outside. Generally, texture formation in a surface of the silicon substrate has been performed by a wet process in which an alkali (KOH) aqueous solution is used as an etchant. In the texture formation by the wet process, a washing process using hydrogen fluoride, a heat treatment process, and the like are necessary as a post treatment. Therefore, in this process, the surface of the silicon substrate may be contaminated, and there is a disadvantage in a cost aspect.

Furthermore, the silicon substrate in which the texture may be formed by the wet process is limited to a silicon substrate having substrate surface orientation (100) (refer to PTL 1 and the like), and it is difficult to form a texture in a surface of a silicon substrate having other substrate surface orientations by the wet process.

On the other hand, methods of forming a texture in a surface of a silicon substrate by a dry process have been suggested. For example, 1) a method of using a technology called reactive ion etching by plasma, 2) a method of etching the surface of the silicon substrate by introducing any one kind of gas selected from $ClF_3$, $XeF_2$, $BrF_3$, and $BrF_5$ into a reaction chamber, in which the silicon substrate is placed, under an atmospheric-pressure atmosphere (refer to PTL 2, PTL 3, and PTL 4), and 3) a method of forming irregularities in the surface of the silicon substrate by emitting a laser beam to the silicon substrate under an oxygen-containing atmosphere (refer to PTL 5 and PTL 6) have been suggested.

Furthermore, an attempt for increasing material efficiency of silicon by making a silicon substrate of a solar cell thin has been conducted (refer to PTL 7). Specifically, since the silicon substrate in the related art is obtained by cutting a silicon ingot into a wafer shape, the thickness thereof becomes several hundred micrometers. However, in the solar cell, a thickness necessary for the silicon substrate, which contributes to photoelectric conversion, is 100 μm or less. Accordingly, when the silicon substrate becomes thin, the material efficiency of the silicon increases.

PTL 7 discloses a method in which ions are implanted into a layer which is arranged at a predetermined depth of a silicon substrate, the silicon substrate to which the ions are implanted is heated, and the silicon substrate is cut at the above-described layer to obtain a thin silicon substrate. Similarly, a method of peeling a surface film of a substrate by emitting ion beams to a surface of the silicon ingot substrate has been suggested (refer to PTL 8 and PTL 9).

On the other hand, solar cells are largely classified into a both-surface electrode type solar cell in which an it electrode and a p electrode are disposed on a light-receiving surface and a rear surface thereof, respectively, and a rear-surface type solar cell in which the n electrode and the p electrode are disposed on the rear surface of the light-receiving surface. As one kind of the rear-surface type solar cell, an aspect in which a PN junction provided on the light-receiving surface and an electrode on the rear surface are connected by a through-hole has been disclosed, and this aspect is called "a metal-warp through structure hack contact cell" (for example, refer to PTL 10 and NPL 1).

CITATION LIST

Patent Literature

PTL 1: Japanese Patent Application Laid-Open No. 2000-150937
PTL 2: Japanese Patent Application Laid-Open No. HEI10-313128
PTL 3: Japanese Patent Application Laid-Open No. 2005-50614
PTL 4: US Patent No 2005/0126627
PTL 5: Japanese Patent Application Laid-Open No. 2009-152569
PTL 6: US Patent No. 2010/0136735
PTL 7: Japanese Patent Application Laid-Open No. HEI9-331077
PTL 8: Japanese Patent Application Laid-Open No. 2009-295973
PTL 9: US Patent No. 2009/0277314
PTL 10: Japanese Patent Application. Laid-Open No. HEI4-223378

Non-Patent Literature

NPL 1: Ichiro IKEDA, "High Efficiency Multi Crystalline Silicon Back Contact Photovoltaic Solar Cell" academic journal of the Japan Institute of Electronics Packaging Vol. 12 No. 6 (2009) p. 485

SUMMARY OF INVENTION

Technical Problem

As described above, texture formation in a surface of a silicon substrate is generally performed by a wet process. In a texture that is obtained in this manner, the height itself of a convex portion is 10 μm or more. Accordingly, when the thickness of the silicon substrate is made thin, for example, when the thickness is set to 50 μm or less, a ratio of the height of the convex portion of the texture with respect to the thickness of the silicon substrate increases excessively. Therefore, it is difficult to secure the strength of the thin silicon substrate. That is, naturally, thinning of the silicon substrate having a textured surface is limited.

Therefore, a first aspect of the present invention is aimed at thinning of a silicon substrate for a solar cell by making a texture of a silicon substrate having a textured surface fine. According to this, the first aspect is aimed at increasing the degree of freedom in designing of the solar cell.

As described above, generally, the texture formation in the surface of the silicon substrate is performed by a wet process. In a texture that is obtained in this manner, the height itself of a convex portion is 10 μm or more. Accordingly, when the thickness of the silicon substrate is made thin, for example, when the thickness is set to 50 μm or less, a ratio of the height of the convex portion of the texture with respect to the thickness of the silicon substrate increases excessively. Therefore, it is difficult to secure the strength of the thin silicon substrate. As a result, the thinning of the silicon substrate having a textured surface is naturally limited.

Particularly, since a through-hole is formed in a silicon substrate for metal-warp through structure back contact cell, there is a tendency for the strength of the silicon substrate to be decreased. Therefore, it is more difficult to realize a thin-layering of the silicon substrate.

A second aspect of the present invention is aimed at the thinning of the silicon substrate in which a through-hole is formed by making the texture of the silicon substrate having the textured surface fine.

Solution to Problem

The present inventors have found that an extremely fine texture can be formed in a surface of a silicon substrate having a specific substrate surface orientation by supplying a specific etching gas to the surface to etch. On the basis of this finding, a thin silicon substrate having a textured surface was obtained.

According to a first aspect of the present invention, there is provided a method of manufacturing a silicon substrate that has a textured surface and a thickness of 50 μm or less. The method includes a process A of preparing a silicon substrate that has a thickness of 50 μm or less and a substrate surface orientation (111), and a process B of blowing an etching gas including a fluorine-containing gas to a substrate surface of the prepared silicon substrate to form a texture.

According to a second aspect of the present invention, there is provided a silicon substrate that has a thickness of 50 μm or less, substrate surface orientation (111), and a textured surface. According to the present invention, a solar cell, which includes the related silicon substrate and in which the textured surface is set as a light-receiving surface, is provided.

According to a third aspect of the present invention, there is provided a method of manufacturing a silicon substrate that has a textured surface and a thickness of 50 μm or less. The method includes a process A of preparing a silicon ingot having substrate surface orientation (111), a process B of supplying an etching gas including a fluorine-containing gas to a surface of the silicon ingot to form a texture, a process C of implanting a dopant to the textured surface to form a PN junction in a surface layer of the silicon ingot, a process D of implanting ions from the textured surface to form an ion-implanted layer, and a process E of dividing the silicon ingot at the ion-implanted layer by applying an impact to the silicon ingot in which the ion-implanted layer is formed to obtain a silicon substrate having a thickness of 50 μm or less.

According to a fourth aspect of the present invention, there is provided a method of manufacturing a silicon substrate that has a textured surface, a through-hole, and a thickness of 50 μm or less. The method includes a process A of preparing a silicon ingot having substrate surface orientation (111), process B of supplying an etching gas including a fluorine-containing gas to a surface of the silicon ingot to form a texture, a process C of irradiating the textured surface with laser to form a hole, a process D of implanting a dopant to the textured surface to form a PN junction in a surface layer of the silicon ingot and an inner wall surface layer of the hole, a process E of implanting ions from the textured surface to form an ion-implanted layer, and a process F of dividing the silicon ingot at the ion-implanted layer by applying an impact to the silicon ingot in which the ion-implanted layer is formed to obtain a silicon substrate having a thickness of 50 μm or less. According to the present invention, there is provided a back contact type solar cell including the silicon substrate that is obtained by the related method, an electrode formed from a conductive film that is formed on an internal surface of the through-hole and is connected to the PN conjunction, and an electrode formed from a conductive film that is formed on a surface that is opposite to the textured surface.

Advantageous Effects of Invention

According to the first aspect of the present invention, a texture is formed in a surface of a silicon substrate regardless of thinning of the silicon substrate. Preferably, an optical reflectance at the textured surface can be sufficiently suppressed, and light that is taken-in is not leaked to the outside. Accordingly, when the textured surface is set as a light-receiving surface, the silicon substrate according to the first aspect of the present invention may be used as a silicon substrate for a solar cell in a particularly appropriate manner.

According to the second aspect of the present invention, a texture is formed in a surface of the silicon substrate and a through-hole is formed in the substrate regardless of thinning of the silicon substrate. Preferably, an optical reflectance at the textured surface can be sufficiently suppressed, and light that is taken-in is not leaked to the outside. Accordingly, when the textured surface is set as a light-receiving surface, the silicon substrate according to the second aspect of the present invention may be used as a silicon substrate for a solar cell called a metal-warp through structure contact cell in a particularly appropriate manner.

BRIEF DESCRIPTION OF DRAWINGS

FIG. 4B is a perspective diagram in which the inside of a decompression chamber is seen through;

DESCRIPTION OF EMBODIMENTS

Figure 1A:
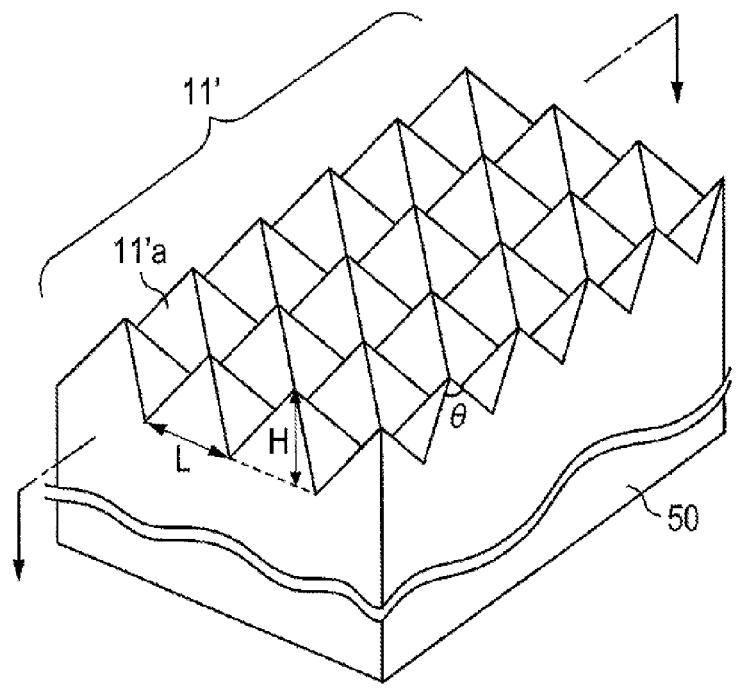
FIG. 1A is a perspective diagram conceptually illustrating protrusions that have a triangular pyramid shape and that make up a texture of a textured surface of a silicon substrate related to Embodiment 1.

Hereinafter, the present invention will be described with reference to embodiments, but the present invention is not limited to the following embodiments. The same or similar reference numerals are given to the parts having the same or similar function, and descriptions thereof will be omitted. However, the attached drawings are only schematic in nature. Therefore, specific dimensions and the like should be determined by consulting the following descriptions. In addition, it is needless to say that portions of which dimensional relationships or ratios are different from each other are included in the attached drawings.

Embodiment 1

1. With Respect to Silicon Substrate Having Textured Surface

The silicon substrate of the present invention is provided with a texture formed in a surface thereof. A substrate surface in which the texture is formed is called a textured surface.

The silicon substrate of the present invention is a single crystal silicon substrate having substrate surface orientation (111). According to a wet etching method using an alkali solution, which is a general texture-forming method in the related art, a texture may be formed in the surface of the silicon substrate, which has the substrate surface orientation (100). However, the texture is not formed in a surface of the silicon substrate, which has substrate surface orientation (111), and the surface of the silicon substrate is etched in an isotropic manner. Conversely, in the present invention, the texture is formed in a single crystal silicon substrate having the substrate surface orientation (111).

In addition, the silicon substrate may be intrinsic silicon, or the silicon substrate may be p-type doped or n-type doped. In addition, in a case of using the silicon substrate as a silicon substrate for a solar cell, it is preferable that a PN junction be formed in the silicon substrate.

The textured surface represents a low-reflection surface. In a case where a reflectance of a mirror surface with respect to light having a wavelength of 0.5 µm to 1.0 µm is set to 100%, it is preferable that the low-reflection surface have a reflectance of approximately 10% or less, and more preferably substantially 0%. In addition, it is preferable that a light absorption rate of the silicon substrate having the textured surface of the present invention be 80% or more. The light absorption rate may be measured by an integrating sphere spectrophotometer, and may be obtained by an equation of "(light absorption rate (%)=100×{intensity of incident light−(intensity of reflected light+intensity of transmitted light)}/intensity of incident light."

Figure 1B:
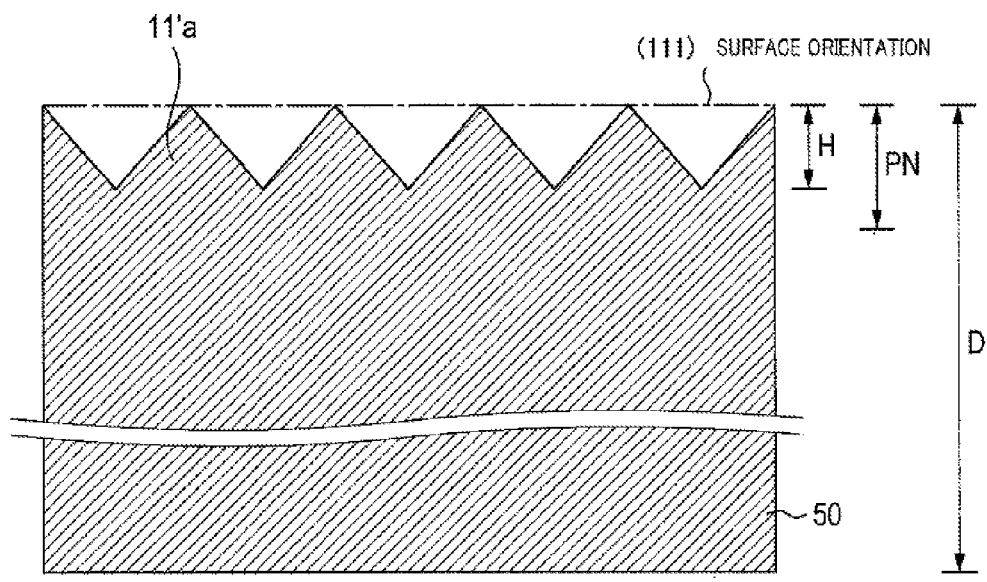
FIG. 1B is a cross-sectional diagram conceptually illustrating the protrusions that have the triangular pyramid shape and that make up the texture of the textured surface of the silicon substrate related to Embodiment 1.

FIG. 1A shows a perspective diagram conceptually illustrating protrusions that have a triangular pyramid shape and that make up the texture of the textured surface of silicon substrate 50 related to Embodiment 1. FIG. 1B shows a cross-sectional diagram conceptually illustrating protrusions 11'a that have the triangular pyramid shape and that make up the texture of textured surface 11' of silicon substrate 50 related to Embodiment 1. As shown in FIGS. 1A and 1B, textured surface 11' of the present invention has pyramid-shaped protrusions 11'a that are obtained by etching a surface having (111) orientation of silicon substrate 50. It is preferable that a plurality of pyramid-shaped protrusions be densely formed in textured surface 11'.

Typically, the pyramid shape is a triangular pyramid shape, but may be another shape such as a conical shape and a quadrangular pyramid shape. The triangular pyramid shape represents a pyramid shape having a triangular bottom surface, and preferably has a vertex. In addition, it is preferable that the triangular pyramid shape be a shape close to a regular triangular pyramid shape, but it is not necessary for the triangular pyramid to be a strict triangular pyramid.

The height H (refer to FIGS. 1A and 1B) of each of the pyramid-shaped (typically, triangular pyramid-shaped) protrusions 11'a is commonly 100 nm to 1.5 µm, and preferably 100 nm to 1 µm. The length L (refer to FIG. 1A) of a diagonal line on the bottom surface of the pyramid-shaped (typically, triangular pyramid-shaped) protrusion is commonly 100 nm to 1.5 µm, and preferably 100 nm to 1 µm. In addition, it is preferable that an vertex angle θ (refer to FIG. 1A) of the pyramid-shaped protrusion be 40° to 80°.

It is preferable that density of protrusion 11'a in textured surface 11' be 10 to 1,000 pieces per unit area (100 µm$^2$).

One of characteristics of the silicon substrate of the present invention is that protrusion 11'a making up the texture formed in textured surface 11' is fine. The more the texture structure is fine, the further optical reflectance on textured surface 11' is suppressed. For example, when processing accuracy of the texture is 1 µm or less, reflection of light having a wavelength of 1 µm on the textured surface may become approximately zero.

On the other hand, the height of the protrusion of the texture, which was formed in the surface of the silicon substrate by a wet etching method or an ion plasma etching method until now, was large and it was difficult to form the fine protrusion like the present invention. For example, the height H of protrusion 11'a of the texture, which is formed by the wet etching method, is 10 µm to 20 µm.

Another characteristic of silicon substrate 50 having textured surface 11' is that the thickness D of the silicon substrate is thin. That is, even when the protrusion that makes up the texture is fine and thus the thickness of the silicon substrate is reduced, the strength of the silicon substrate may be maintained.

It is preferable that the thickness D (including the height of the protrusion of the texture) of the silicon substrate be 50 µm or less, and the thickness D may be 20 µm or less. The lower limit of the thickness of the silicon substrate is not particularly limited and is an arbitrary value as long as the strength necessary for the substrate may be maintained, and commonly, the lower limit is 10 µm or more.

The texture may be formed in the entirety of the surface of the silicon substrate, or the texture may be formed at a part thereof. For example, in a case where the silicon substrate of the present invention is used as a silicon substrate for a solar cell, it is preferable that a region, at which a front-surface electrode (including a connector electrode, a bar electrode, a grid electrode, or the like) is disposed on a light-receiving surface side, be flat without the texture formed therein.

In addition, in a case where the silicon substrate of the present invention is used as a semiconductor substrate for a solar cell, it is preferable for the silicon substrate to have a PN junction. In a case where the silicon substrate is p-type doped, the PN junction may be formed by subjecting the surface layer of the textured surface to n-type doping to form an emitter layer. In addition, in a case where the silicon substrate is n-type doped, the PN junction may be formed by subjecting the surface layer of the texture surface to p-type doping to form the emitter layer. As shown in FIG. 1B, it is preferable that the PN junction be formed in a region, which ranges from the textured surface to a depth PN of 0.01 µm to 0.1 µm, and for example, the PN junction is preferably formed in a region ranging from the textured surface to a depth PN of approximately 0.05 µm, but there is no particular limitation.

2. With Respect to Method of Manufacturing Silicon Substrate Having Textured Surface Although a method of manufacturing the silicon substrate having the textured surface of the present invention is not particularly limited, the silicon substrate may be manufactured on the basis of the following method.

Figure 2A:
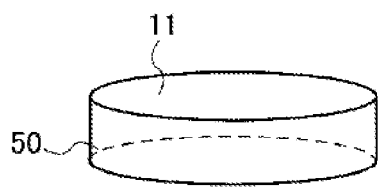
FIG. 2A is a diagram illustrating a manufacturing flow of the silicon substrate related to Embodiment 1.
Figure 2B:
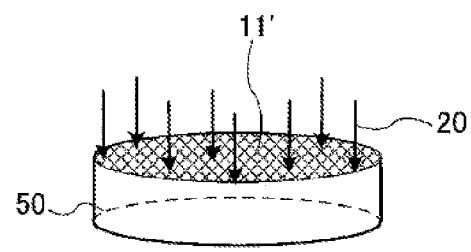
FIG. 2B is a diagram illustrating the manufacturing flow of the silicon substrate related to Embodiment 1.
Figure 2C:
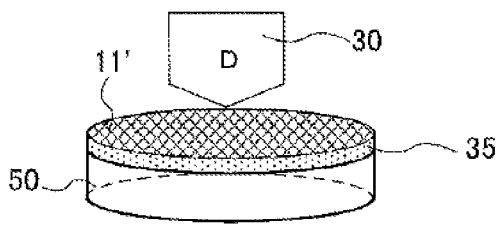
FIG. 2C is a diagram illustrating a process of manufacturing an arbitrary silicon substrate.

FIGS. 2A and 2B show diagrams illustrating a manufacturing flow of the silicon substrate related to Embodiment 1. The silicon substrate having the textured surface of the present invention may be manufactured by a method including a process A of preparing a silicon substrate that has a thickness of 50 µm or less and a substrate surface orientation (111) (refer to FIG. 2A), and a process B of blowing an etching gas including a fluorine-containing gas to a substrate surface (substrate surface orientation (111)) of the prepared silicon substrate to form a texture (refer to FIG. 2B). Furthermore, as an arbitrary process, a doping process shown in FIG. 2C may be performed. Hereinafter, each process will be described.

Figure 2D:
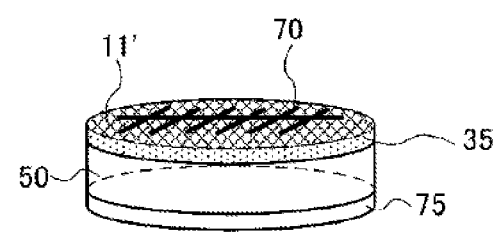
FIG. 2D is a diagram illustrating a process of obtaining a solar cell.

In addition, as shown in FIG. 2D, after being undergone a process of forming a front-surface electrode 70 and rear-surface electrode 75, a solar cell is formed.

With Respect to Process A (Process of Preparing Silicon Substrate)

Figure 3A:
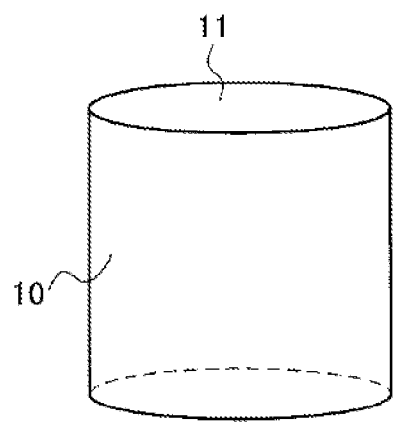
FIG. 3A is a diagram illustrating the manufacturing flow of the silicon substrate related to Embodiment 1.
Figure 3B:
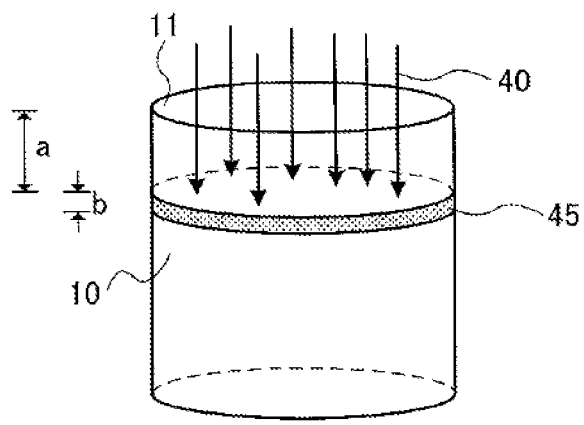
FIG. 3B is a diagram illustrating the manufacturing flow of the silicon substrate related to Embodiment 1.
Figure 3C:
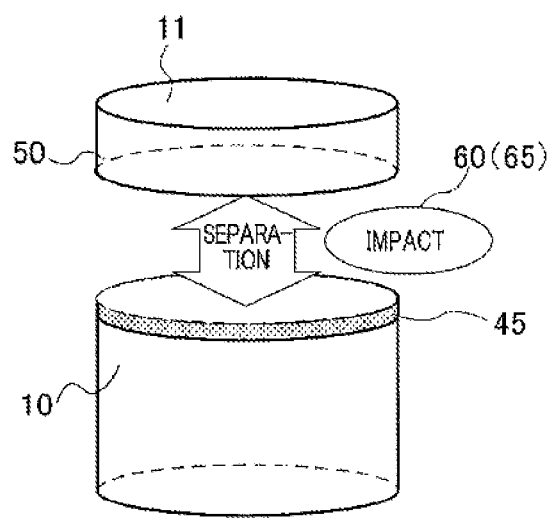
FIG. 3C is a diagram illustrating the manufacturing flow of the silicon substrate related to Embodiment 1.

A silicon substrate that has a thickness of 50 µm or less and substrate surface orientation (111) is prepared. Specifically, processes as shown in FIGS. 3A to 3C may be performed. That is, the silicon substrate that is prepared in the process A may be manufactured by a method including a process a1 of preparing a silicon ingot having the substrate surface orientation (111) (refer to FIG. 3A), a process a2 of implanting ions to a region of the silicon ingot at a depth of 50 µm or less from an ingot surface to form an ion-implanted layer (refer to FIG. 3B), and a process a3 of cutting the ingot at the ion-implanted layer by applying an impact to the ingot in which the ion-implanted layer is formed to obtain a silicon substrate having a thickness of 50 μm or less (refer to FIG. 3C).

Silicon ingot 10 that is prepared in the process a1 is a silicon ingot having the substrate surface orientation (111) (refer to FIG. 3A). The silicon ingot may be intrinsic silicon, or the silicon ingot may be p-type or n-type doped. In a case of obtaining a silicon substrate for a solar cell, a doped silicon ingot is frequently prepared. A silicon substrate for a normal solar cell has a PN junction. When silicon ingot 10 is p-type or n-type doped, it is easy for the silicon substrate having the PN junction to be manufactured.

In the process a2, ions 40 are implanted from substrate surface 11 (111 plane) of silicon ingot 10 (refer to FIG. 3B). Implanted ions 40 may be hydrogen ions (protons), nitrogen ions, rare gas (argon or the like) ions, or the like. Implanted ions 40 are made to be present in a layered region of silicon ingot 10 at "constant depth a" from substrate surface 11 to form ion-implanted layer 45 (refer to FIG. 3B). The "constant depth a" represents a depth of 50 μm or less, and preferably 20 μm or less. It is possible to adjust the thickness of the obtained silicon substrate by adjusting the depth. Although not particularly limited, the "thickness b" of ion-implanted layer 45 may be set to approximately 0.7 μm.

In the process a2, acceleration energy or a dose amount of the ions that are implanted is adjusted in order for the ions to be present in the layered region of silicon ingot 10 at "constant depth a" from substrate surface 11.

In the process a3, an impact is applied to silicon ingot 10 in which ion-implanted layer 45 is formed (refer to FIG. 3C). Means for applying an impact may be laser irradiation or heating treatment, but be accomplished by irradiation of atmospheric-pressure plasma 40. There is an advantage that a defect, which may occur in silicon ingot 10 due to ions 40 that are implanted in the process a2, may be repaired by the irradiation of atmospheric-pressure plasma 40 instead of laser irradiation.

In the process a3, after the irradiation of atmospheric-pressure plasma 60, irradiation of dry ultrasonic wave 65 may be further performed so as to apply an impact to silicon ingot 10 (refer to FIG. 3C). The irradiation of dry ultrasonic wave 65 has an advantage that a special facility is not necessary and a process cost is reduced.

Silicon ingot 10 to which an impact is applied in the process a3 is divided at ion-implanted layer 45 set as a boundary (refer to FIG. 3C). As a result, silicon substrate 50, which has a thickness of 50 μm or less and substrate surface 11 having substrate surface orientation (111), can be obtained. In addition, in this drawing, ion-implanted layer 45 is indicated to remain on a surface of silicon ingot 10. Alternatively, ion-implanted layer 45 may remain on a bottom surface (on a side that is opposite to the textured surface) of silicon substrate 50 or may remain on the surface of silicon ingot 10 and the bottom surface of silicon surface 50.

With Respect to Process B (Process of Forming Texture Surface)

A texture is formed in surface 11 of silicon substrate 50, which is prepared in the process A, to form, textured surface 11' (refer to FIG. 2B). It is preferable that the formation of the texture be performed by gas (dry) etching in which etching gas 20 is blown to surface 11 (refer to FIG. 2A) of silicon substrate 50 (refer to FIG. 2B). This is because the thickness of silicon substrate 50 is small and thus it is necessary to make the size of the texture (the height of the protrusion of the irregularities) small. According to wet etching using an alkali solution or reactive ion etching using plasma which is a general method of forming a texture in the related art, the size of the texture to be formed becomes too large, and thus silicon substrate 50 is damaged.

Conversely, in the present invention, specific etching gas 20 is blown to surface 11 having the substrate surface orientation (111) to gas-etch the surface, whereby a fine texture is formed.

Etching gas 20 includes a fluorine-containing gas. Examples of the fluorine-containing gas include $ClF_3$, $XeF_2$, $BrF_3$, BrF5, $NF_3$, and the like. The fluorine-containing gas may be a mixed gas of two kinds or more of these gases.

A molecule of the fluorine-containing gas is physically adsorbed on the surface of the silicon substrate and migrates to an etching site. The gas molecule that reaches the etching site is decomposed and reacts with silicon, whereby a volatile fluorine compound is generated. According to this, the surface of the silicon ingot is etched, and thus the texture is formed.

It is preferable that an inert gas be further contained in etching gas 20 together with the fluorine-containing gas. The inert gas may be a nitrogen gas, an argon gas, helium, or the like, and the inert gas may be a gas that does not have reactivity with silicon. The inert gas that is contained in etching gas 20 may be a mixed gas of two kinds or more of gases.

A total concentration (volume concentration) of the inert gas in etching gas 20 is preferably three times or more with respect to a total concentration of the fluorine-containing gas, and may be 10 times or more or 20 times or more. As the total concentration of the fluorine-containing gas in etching gas 20 becomes higher, there is a tendency for the triangular pyramid-shaped protrusion (protrusion of the texture) to be large (the height of the protrusion increases). Accordingly, if it is desired to make the protrusion small, it is preferable that the concentration of the inert gas be made to increase, and the concentration of the fluorine-containing gas be made to relatively decrease. On the other hand, in a case where the concentration of the inert gas in etching gas 20 becomes lower, and the concentration of the fluorine-containing gas becomes relatively higher, there is a tendency for the surface of the silicon ingot to be etched in an isotropic manner, and thus it is difficult to form a desired texture in the surface of the silicon ingot.

When the concentration of the inert gas in etching gas 20 becomes lower, and the concentration of the fluorine-containing gas becomes relatively higher, there is a tendency for the surface of the silicon substrate to be etched in an isotropic manner, and thus it is difficult to form a desired texture in the surface of the silicon substrate.

Furthermore, it is preferable that a gas, which contains an oxygen atom in a molecule thereof, be further included in etching gas 20 together with the fluorine-containing gas. The oxygen atom-containing gas is typically an oxygen gas ($O_2$), but may be carbon dioxide ($CO_2$), nitrogen dioxide ($NO_2$), or the like.

It is preferable that a concentration (volume concentration) of the oxygen atom-containing gas in etching gas 20 exceeds 2 times a total concentration of the fluorine-containing gas, and more preferably four times or more. In addition, it is preferable that the concentration (volume concentration) of the oxygen atom-containing gas in etching gas 20 be 30% to 80% with respect to the total concentration of the fluorine-containing gas and the inert gas. When the concentration of the oxygen atom-containing gas in etching gas 20 is too low, a desired texture may not be obtained due to over-etching.

When the oxygen atom-containing gas is included in etching gas 20, appropriate irregularities may be formed in a surface of a semiconductor substrate as a texture of a solar cell. Although the reason is not particularly limited, for example, when a $ClF_3$ gas is physically adsorbed on a silicon surface, the $ClF_3$ gas reacts with silicon and turns into $SiF_4$, whereby silicon is gasified. At this time, when the oxygen atom terminates at a dangling bond of a silicon network structure, a Si—O bond is partially constructed. According to this, a region (Si—Si bond) that is easy to be etched and a region (Si—O bond) that is hard to be etched may be established. It is considered that a chemical reaction is promoted due to a difference in an etching rate thereof, and thus a shape control becomes possible.

In the process B of the method of manufacturing the silicon substrate of the present invention, it is important to maintain a temperature of silicon substrate 50 at a low temperature during gas etching. It is preferable that the temperature of silicon substrate 50 be maintained at 130° C. or lower, more preferably 100° C. or lower, and still more preferably 80° C. or lower. It is preferable to maintain a temperature of a stage, on which silicon substrate 50 is placed, at approximately room temperature (25° C.) or lower so as to maintain the temperature of silicon substrate 50 at a low temperature.

In the process B of the method of manufacturing the silicon substrate of the present invention, a step of blowing a cooling gas to the silicon substrate may be included. Similar to the above-described inert gas, the cooling gas represents a nitrogen gas, argon, helium, or the like. When the cooling gas is blown to the silicon substrate that generates heat due to the reaction with the etching gas, the substrate that has generated heat is cooled.

In the process B of the method of manufacturing the silicon substrate of the present invention, a step of blowing the etching gas to silicon substrate 50 and a step of blowing the cooling gas to silicon substrate 50 may be alternately repeated. The substrate temperature is maintained at a low temperature by controlling a process time of the step of blowing the etching gas to silicon substrate 50. Although not particularly limited, the process time may be approximately 1 minute to 10 minutes. After the step of blowing the etching gas to silicon substrate 50, the cooling gas may be blown to lower the substrate temperature and then the etching gas may be blown again to silicon substrate 50.

After converting surface 11 of silicon substrate 50 into textured surface 11' having a desired texture (refer to FIG. 2B) by etching gas 20, it is preferable to remove the etching gas or decomposed product thereof that remains in silicon substrate 50. For example, a remaining fluorine component may be removed by placing silicon substrate 50 under a hydrogen gas atmosphere.

With Respect to Process C (Process of Forming PN Junction)

In addition to the above-described process A and process B, as an arbitrary process, an emitter layer may be formed by doping dopant 30 to textured surface 11'. According to this, PN junction 35 is formed in silicon substrate 50 (refer to FIG. 2C). PN junction 35 may be formed as follows. Specifically, 1) the doping is performed using a method (glass application method) in which phosphosilicate glass (PSG) is applied to textured surface 11', and the surface layer is N-type doped, or 2) textured surface 11' is heated under a phosphorus oxychloride gas atmosphere, and an N-type emitter layer is formed in textured surface 11' to form the PN junction. However, since silicon substrate 50 is very thin, there is a concern that silicon substrate 50 may be warped depending on the methods.

Therefore, it is preferable that PN junction 35 be formed by performing the doping using atmospheric-pressure plasma.

For example, the surface layer may be p-type doped by implanting boron to textured surface 11' as atmospheric-pressure plasma.

3. With Respect to Usage of Silicon Substrate Having Textured Surface

The silicon substrate of the present invention is preferably used as a silicon substrate for a solar cell. When the silicon substrate of the present invention is used for the solar cell, front-surface electrode 70 is disposed on a light-receiving surface that is a textured surface, and rear-surface electrode 75 is disposed on a non-light-receiving surface, whereby a solar cell may be obtained (refer to FIG. 2D). An aspect of the solar cell is not limited to the above-described aspect.

In addition, an anti-reflection layer may be laminated on textured surface 11' (not shown). The anti-reflection layer may further decrease a reflectance in the solar cell, thereby improving a photoelectric conversion rate. Examples of the anti-reflection layer include a silicon nitride film, a titanium oxide film, and the like.

Experimental Example of Embodiment 1

An experimental example in which a fine texture is formed in the surface of the silicon ingot having the substrate surface on orientation (111) will be described.

Figure 4A:
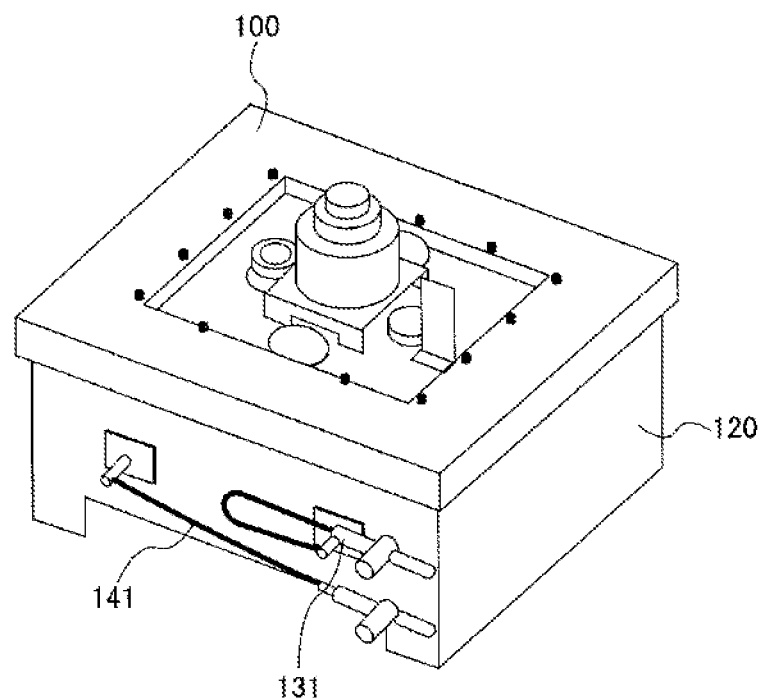
FIG. 4A is an external perspective diagram of a texture-forming apparatus that is used to form a texture in a surface of the silicon substrate in an example related to Embodiment 1.
Figure 4B:
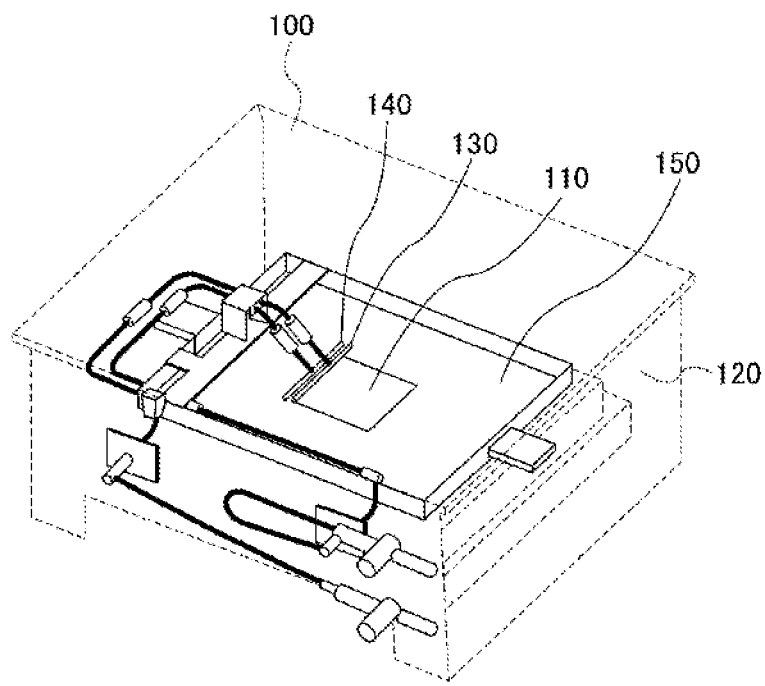

FIG. 4A shows an external perspective diagram of texture-forming apparatus 100 that is used in this experimental example. FIG. 4B shows a perspective diagram in which the inside of decompression chamber 120 is seen through. Texture-forming apparatus 100 shown in FIGS. 4A and 4B includes, in decompression chamber 120, nozzle 130 that ejects an etching gas, nozzle 140 that ejects a cooling gas, and stage 150 on which silicon ingot (silicon substrate) 110 is placed. Nozzle 130 is connected to etching gas supply pipe 131. Nozzle 140 that ejects the cooling gas is connected to cooling gas supply pipe 141. The silicon ingot having a textured surface was manufactured by blowing the etching gas and the cooling gas to silicon ingot 110 that was placed on stage 150.

Silicon ingot 110 having the substrate surface orientation (111) was placed on stage 150 of texture-forming apparatus 100 shown in FIGS. 4A and 4B. A distance between nozzle 130 and silicon ingot 110 was set to 10 mm. An area of a substrate surface of silicon ingot 110 was 125 mm×125 mm. A temperature of stage 150 was set to 25° C. A pressure inside decompression chamber 120 was adjusted to 30 KPa, and then the etching gas supplied from nozzle 130 was blown to the entire surface of silicon ingot 110 for 3 minutes. A composition of the blown etching gas was set to "$ClF_3/O_2/N_2$=50 to 1,000 cc/2,000 cc/2,000 to 5,000 cc."

Figure 5A:
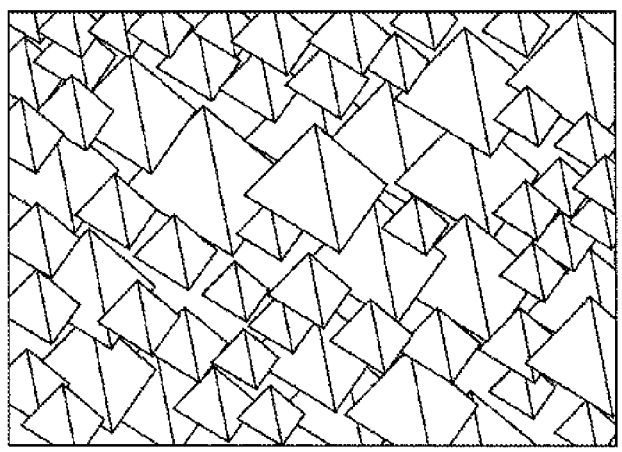
FIG. 5A is a schematic diagram of the texture in the textured surface of the silicon substrate related to Embodiment 1.
Figure 5B:
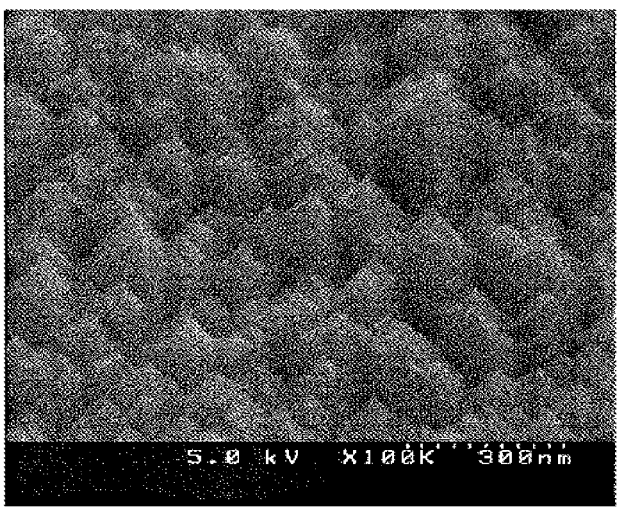
FIG. 5B is a microscope photograph illustrating an example of the texture in the textured surface of the silicon substrate related to Embodiment 1.
Figure 5C:
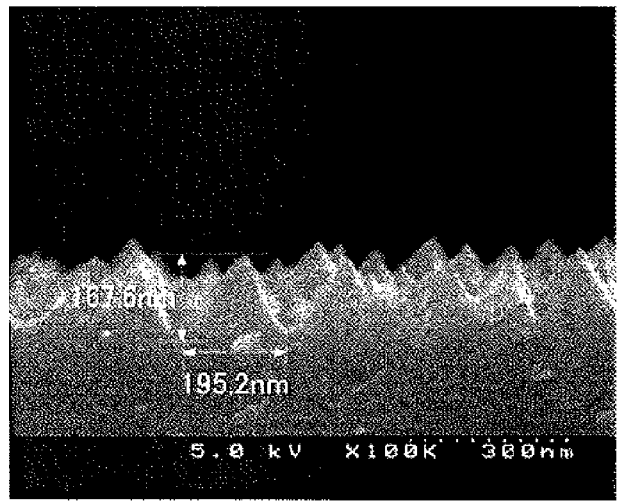
FIG. 5C is a microscope photograph illustrating an example of the texture in the textured surface of the silicon substrate related to Embodiment 1.

The textured surfaces of the silicon ingot, which were obtained, are shown in FIGS. 5A to 5C. FIG. 5A shows a schematic diagram of the textured surface. FIG. 5B shows a microscope photograph thereof, and it can be seen that protrusions having a triangular pyramid shape are densely formed. In addition, as shown in FIG. 5C, it can be seen that the height of each of protrusion is 100 nm to 200 nm.

As described above, since the fine texture may be formed according to the method of the present invention, even in a silicon substrate having a thickness of 50 μm or less, the mechanical strength thereof is maintained, and thus this silicon substrate may be used as a silicon, substrate for a solar cell.

Embodiment 2

Embodiment 2 will be mainly described on the basis of the difference from Embodiment 1. FIGS. 6A to 6E show flow diagrams of a first method of manufacturing a silicon substrate having a textured surface related to Embodiment 2. As shown in FIGS. 6A to 6F, the first manufacturing method includes a process A of preparing silicon ingot 10 (refer to FIG. 6A), a process B of forming a texture in surface 11 of silicon ingot 10 to convert surface 11 into textured surface 11' (refer to FIG. 6B), a process C of implanting dopant 30 to textured surface 11' to form PN junction 35 (refer to FIG. 6C), a process D of implanting ions 40 from textured surface 11' to form ion-implanted layer 45 (refer to FIG. 6D), and a process E of dividing silicon ingot 10 by applying an impact to silicon ingot 10 in which ion-implanted layer 45 is formed to obtain silicon substrate 50 (refer to FIG. 6E). Hereinafter, each process will be described. Furthermore, as shown in FIG. 6F, after undergoing a process of forming front-surface electrode 70 and rear-surface electrode 75, a solar cell is obtained.

With Respect to Process A (Process of Preparing Silicon Ingot)

Figure 6A:
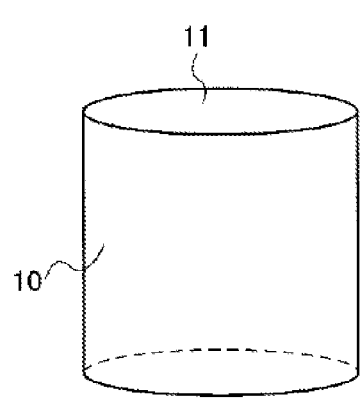
FIG. 6A is a diagram illustrating a flow of a first manufacturing method of a silicon substrate related to Embodiment 2.

As shown in FIG. 6A, silicon ingot 10 is prepared. Silicon ingot 10 that is prepared in the process A is a single crystal silicon ingot having substrate surface orientation (111). One of characteristics of the method of manufacturing the silicon ingot of the present invention is that a texture is formed in a surface of the silicon ingot, which has the substrate surface orientation (111). According to a wet etching method using an alkali solution, which is a general texture-forming method in the related art, a texture may be formed in the surface of the silicon ingot, which has the substrate surface orientation (100). However, the texture may not be formed in a surface of the silicon ingot, which has substrate surface orientation (111), and thus the surface of the silicon substrate is caused to be etched in an isotropic manner. Conversely, in the present invention, the texture is formed in a single crystal silicon ingot having the substrate surface orientation (111).

In addition, it is preferable that the silicon ingot, be p-type doped or n-type doped. This is because when the silicon ingot is doped in advance, it is easy to form a PN junction in the process C to be described later.

With Respect to Process B (Process of Forming Textured Surface)

Figure 6B:
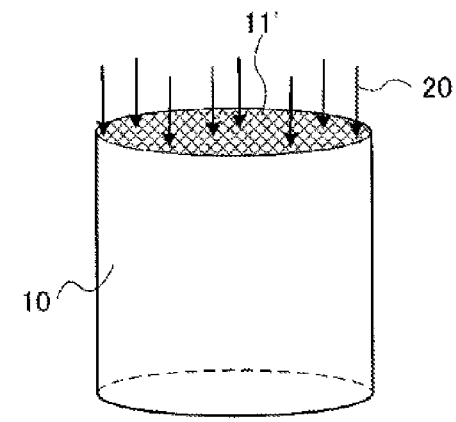
FIG. 6B is a diagram illustrating the flow of the first manufacturing method of the silicon substrate related to Embodiment 2.

As shown in FIG. 6B, a texture is formed in surface 11 of silicon ingot 10 to convert surface 11 into textured surface 11'. The formation of the texture is preferably performed by gas etching (dry etching) in which etching gas 20 is blown. This is because the thickness of the silicon substrate that is manufactured by the present invention is thin, and thus it is necessary to make the size of the texture (the height of the protrusion of irregularities) small. The small size of the texture represents that for example, the height of the protrusion is within a range of 100 nm to 1,500 nm, and preferably 100 nm to 1,000 nm.

According to wet etching using an alkali solution or reactive ion etching using plasma, which is a general method of forming a texture in the related art, the size of the texture to be formed becomes too large (for example, the height of the protrusion of the irregularities becomes approximately 10 μm), and thus it is difficult to obtain a thin silicon substrate. As an etching gas, the same etching gas as Embodiment 1 may be used.

During the etching in the process B, it is important to maintain a temperature of the silicon ingot at a low temperature. It is preferable that the temperature of silicon ingot 50 be maintained at 130° C. or tower, more preferably 100° C. or lower, and still more preferably 80° C. or lower. It is preferable to maintain a temperature of a stage, on which the silicon ingot is placed, at approximately room temperature (25° C.) so as to maintain the temperature of silicon ingot at a low temperature.

The process B may include a step of blowing the cooling gas to the surface of the silicon ingot. Similar to the above-described inert gas, the cooling gas represents a nitrogen gas, an argon gas, a helium gas, or the like. When the cooling gas is blown to the surface of the silicon ingot that has generated heat due to the reaction with the etching gas, the silicon ingot that has generated heat may be cooled.

In the process B, a step of blowing the etching gas to the silicon ingot and a step of blowing the cooling gas to the silicon ingot may be alternately repealed. The temperature of the silicon ingot is maintained at a low temperature by controlling a process time of the step of blowing the etching gas to the silicon ingot. Although not particularly limited, the process time may be 1 minute to 10 minutes. After the step of blowing the etching gas to the silicon ingot, the cooling gas may be blown to lower the temperature of the silicon ingot, and then the etching gas may be blown again to the silicon ingot.

Figure 7A:
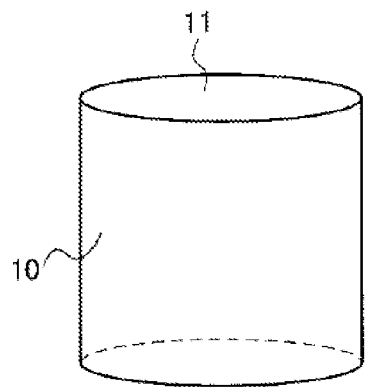
FIG. 7A is a diagram illustrating a flow of a second manufacturing method of the silicon substrate related to Embodiment 2.
Figure 7B:
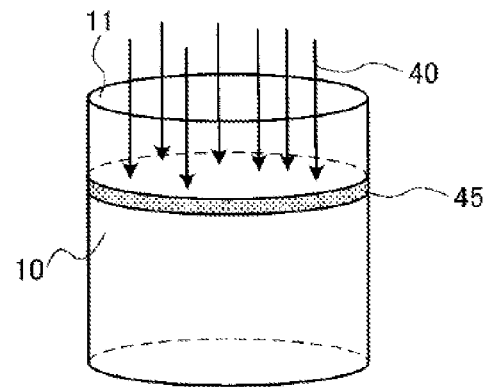
FIG. 7B is a diagram illustrating the flow of the second manufacturing method of the silicon substrate related to Embodiment 2.
Figure 7C:
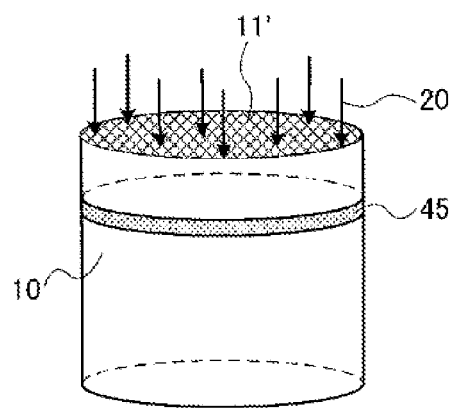
FIG. 7C is a diagram illustrating the flow of the second manufacturing method of the silicon, substrate related to Embodiment 2.
Figure 8A:
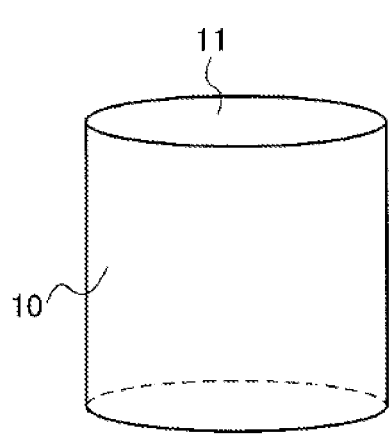
FIG. 8A is a diagram illustrating a flow of a third manufacturing method of the silicon substrate related to Embodiment 2.
Figure 8B:
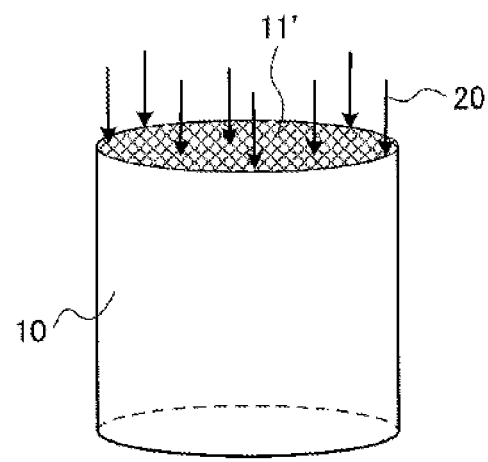
FIG. 8B is a diagram illustrating the flow of the third manufacturing method of the silicon substrate related to Embodiment 2.

When textured surface 11' having a desired texture (refer to FIGS. 6B, 7C, and 8B) is formed in the surface of the in silicon ingot by the etching gas, it is preferable to remove the etching gas or decomposed product thereof that remains in the silicon ingot. For example, a remaining fluorine component may be removed by placing the silicon ingot under a hydrogen gas atmosphere.

With Respect to Process C (Process of Forming PN Junction)

Figure 6C:
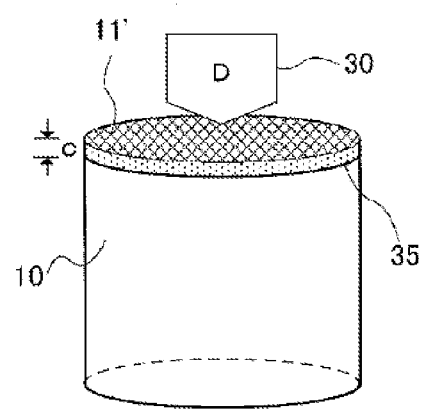
FIG. 6C is a diagram illustrating the flow of the first manufacturing method of the silicon substrate related to Embodiment 2.

As shown in FIG. 6C, dopant 30 is implanted to the silicon ingot through textured surface 11' to form PN junction 35. In a case where the silicon ingot is P-type doped, the PN junction may be formed by subjecting the surface layer of the textured surface to N-type doping to form an emitter layer. In addition, in a case where the silicon ingot is n-type doped, the PN junction may be formed by subjecting the surface layer of the texture surface to P-type doping to form the emitter layer. It is preferable that the PN junction be formed in a region ranging from textured surface 11' to a depth of 0.01 μm to 0.1 μm, and for example, the PN junction is preferably formed in a region ranging from textured surface 11' to a depth of approximately 0.05 μm.

The doping of the surface layer of textured surface 11' may be realized using a method in which a dopant-containing gas is vapor-phase-diffused, a method in which a dopant-containing solution is applied to textured surface 11' and then the dopant is thermally diffused, or a method in which the textured surface' is irradiated with atmospheric-pressure plasma under a dopant-containing atmosphere. For example, in a case where the silicon ingot is p-type doped, 1) the textured surface is heated in a phosphorus oxychloride gas and phosphorous is vapor-phase-diffused to the surface layer of textured surface 11', or 2) the textured surface is irradiated with atmospheric-pressure plasma under a phosphorous-containing atmosphere. After the diffusion of the dopant, annealing (for example, heat treatment) may be performed for activation.

With Respect to Process D (Process of Forming Ion-Implanted Layer)

Figure 6D:
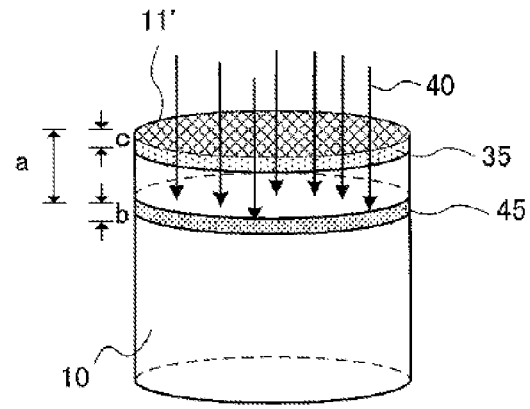
FIG. 6D is a diagram illustrating the flow of the first manufacturing method of the silicon substrate related to Embodiment 2.
Figure 8C:
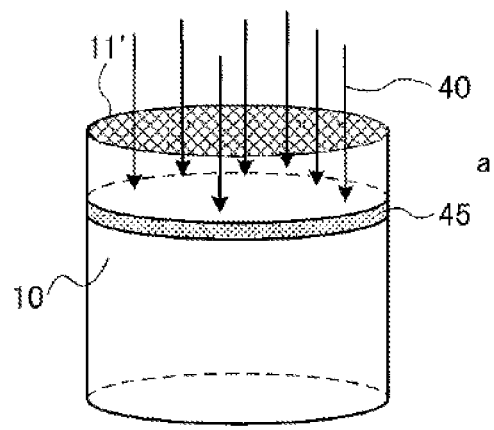
FIG. 8C is a diagram illustrating the flow of the third manufacturing method of the silicon substrate related to Embodiment 2.
Figure 8D:
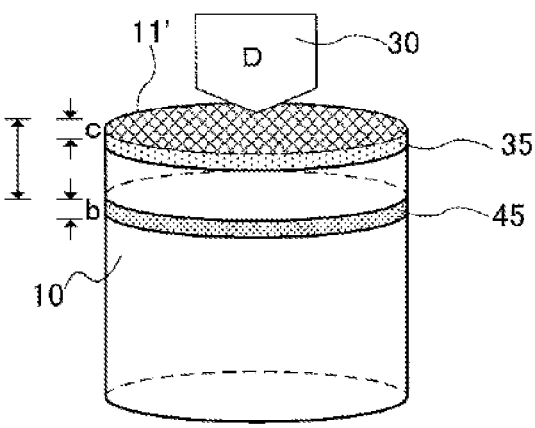
FIG. 8D is a diagram illustrating the flow of the third manufacturing method of the silicon substrate related to Embodiment 2.

As shown in FIG. 6D, ions 40 are implanted to silicon ingot 10 from textured surface 11' to form ion-implanted layer 45. In addition, in the manufacturing method related to Embodiment 2, the process (D process) of forming ion-implanted layer 45 is performed after forming PN junction 35. However, the process of forming ion-implanted layer 45 is not particularly limited, and may be performed before or after another process. For example, the process may be performed before forming the texture as a process D' (refer to FIG. 7B), or may be performed after forming the texture and before the forming the PN junction as a process D" (refer to FIG. 8C).

In the process D (process D' and process D"), ions 40 are implanted to the silicon ingot through the surface (111 plane) of silicon ingot 10. Here, the surface of silicon ingot 10 may be textured surface 11' (refer to FIGS. 6D and 8C), or non-textured surface 11 (refer to FIG. 7B). Examples of ions 40 that are implanted include hydrogen ions (protons), nitrogen ions, rare gas (argon or the like) ions, and the like. Implanted ions are made to be present in a layered region of the silicon ingot at "constant depth a" from the substrate surface to form ion-implanted layer 45. The "constant depth a" represents a depth of 50 μm or less, and preferably 20 μm or less. It is possible to adjust the thickness of the manufactured silicon substrate by adjusting the depth.

In the process D (process D' and process D"), acceleration energy or a dose amount of the ions that are implanted is adjusted in order to form ion-implanted layer 45 in the layered region of silicon ingot at the "constant depth a" from the substrate surface of the silicon ingot. Although not particularly limited, the "thickness b" of ion-implanted layer 45 may be set to approximately 0.7 μm.

With Respect to Process E (Process of Dividing Silicon Ingot)

Figure 6E:
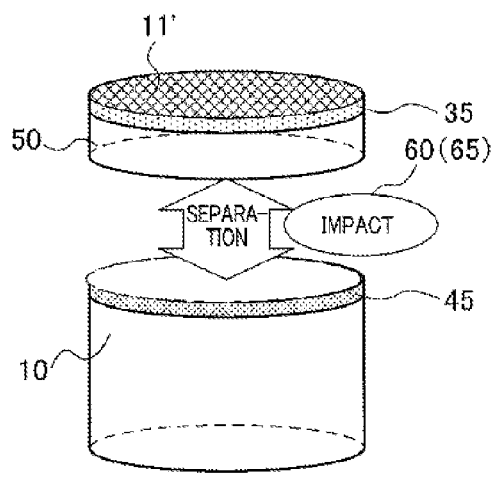
FIG. 6E is a diagram illustrating the flow of the first manufacturing method of the silicon substrate related to Embodiment 2.
Figure 6F:
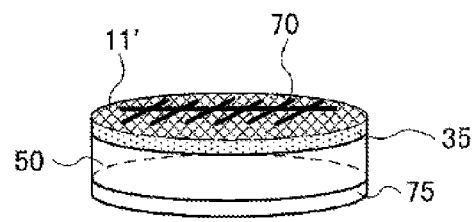
FIG. 6F is a diagram illustrating a process of obtaining a solar cell.

As shown in FIG. 6E, an impact is applied to silicon ingot 10 in which ion-implanted layer 45 is formed. Means for applying an impact may be laser irradiation or heating treatment. The heating represents heating, for example, at 500° C. Furthermore, the impact may be applied to the silicon ingot by irradiation of atmospheric-pressure plasma 60. There is an advantage that a defect, which may occur in silicon ingot 10 due to ions 40 that are implanted in the process D, may be repaired by the irradiation of atmospheric-pressure plasma 60 instead of laser irradiation.

Furthermore, in the process E, after the irradiation of atmospheric-pressure plasma 60, irradiation of dry ultrasonic wave 65 may be further performed so as to apply an impact to silicon ingot. The irradiation of dry ultrasonic wave 65 has an advantage that a special facility is not necessary and a process cost is reduced.

Figure 7D:
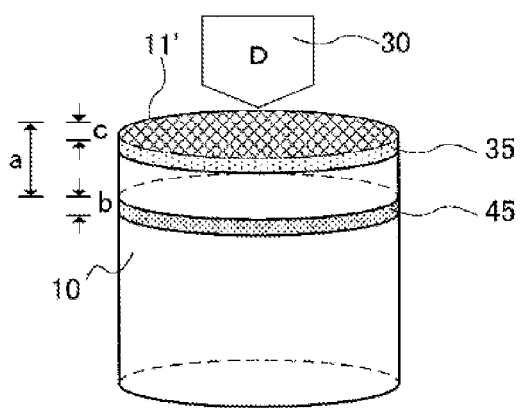
FIG. 7D is a diagram illustrating the flow of the second manufacturing method of the silicon substrate related to Embodiment 2.
Figure 7E:
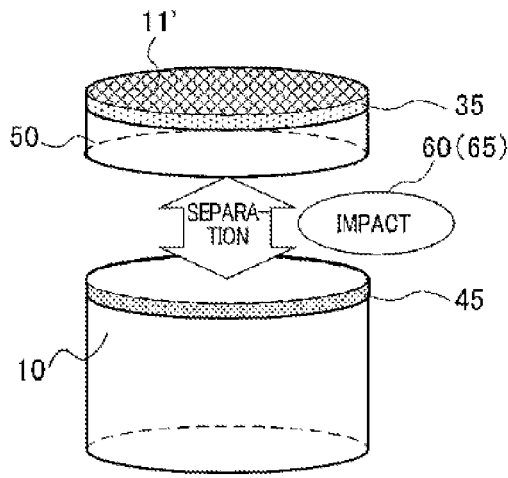
FIG. 7E is a diagram illustrating the flow of the second manufacturing method of the silicon substrate related to Embodiment 2.
Figure 8E:
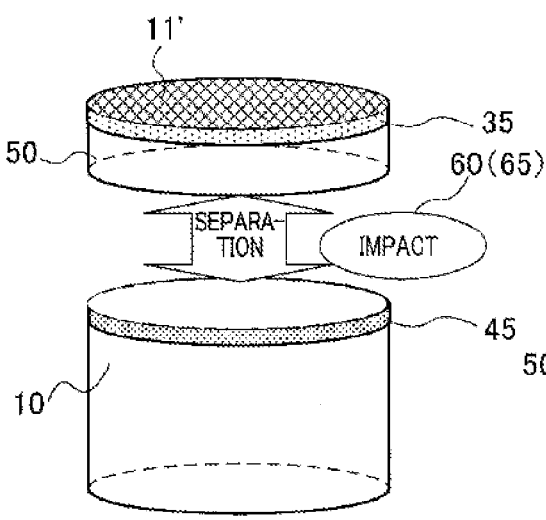
FIG. 8E is a diagram illustrating the flow of the third manufacturing method of the silicon substrate related to Embodiment 2.

Silicon ingot to which an impact is applied in the process E is divided at ion-implanted layer 45 set as a boundary (refer to FIGS. 6E, 7E, and 8E). As a result, silicon substrate 50, which has textured surface 11', a thickness of 50 μm or less, and substrate surface orientation (111), may be obtained.

It is preferable to use the silicon substrate, which is manufactured by the present invention, as a silicon substrate for a solar cell. When the silicon substrate is used for the silicon substrate for the solar cell, it is preferable to laminate an anti-reflection layer on an emitter layer. This is because the anti-reflection layer may further decrease a reflectance on the textured surface, thereby improving a photoelectric conversion rate of the solar cell. Examples of the anti-reflection layer include a silicon nitride film, a titanium oxide film, and the like.

With Respect to Process of Forming Electrode

Figure 7F:
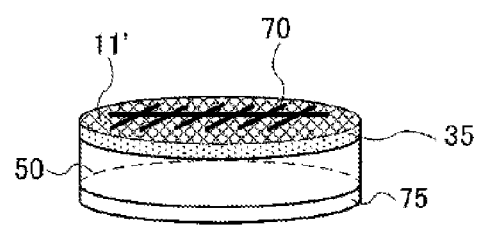
FIG. 7F is a diagram illustrating a process of obtaining a solar cell.
Figure 8F:
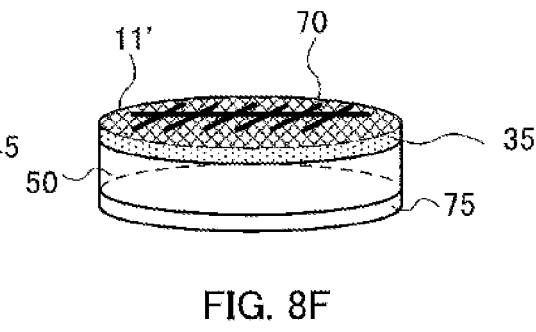
FIG. 8F is a diagram illustrating a process of obtaining a solar cell.

In addition to the above-described processes, as an arbitrary process, front-surface electrode 70 is disposed on a light-receiving surface that is a textured surface, and rear-surface electrode 75 is disposed on a non-light-receiving surface, whereby a solar cell may be obtained (refer to FIGS. 6F, 7F, and 8F). For example, front-surface electrode 70 is a silver interconnection. For example, rear-surface electrode 75 is an aluminum deposited film. An aspect of the solar cell is not limited thereto.

Hereinbefore, Embodiment 2 has been described, but Embodiment 2 is not limited to the above description, and various modification examples may be considered. For example, the following second and third manufacturing methods may be considered. FIGS. 7A to 7F show flow diagrams of a second method of manufacturing the silicon substrate having the textured surface related to Embodiment 2 In the first manufacturing method of Embodiment 2, after forming PN junction 35 as shown in FIGS. 6B and 6C, ion-implanted layer 45 is formed as shown in FIG. 6D. However, as shown in FIGS. 7B, 7C, and 7D, PN junction 35 may be formed after forming ion-implanted layer 45. That is, the second manufacturing method includes a process A of preparing silicon ingot 10 (refer to FIG. 7A), a process D' of implanting ions 40 from non-textured surface 11 of silicon ingot 10 to form ion-implanted layer 45 (refer to FIG. 7B), process B of forming a texture in non-textured surface 11 of silicon ingot 10 to convert surface 11 into textured surface 11' (refer to FIG. 7C), a process C of implanting dopant 30 to textured surface 11' to form PN junction. 35 (refer to FIG. 7D), and a process E of dividing silicon ingot 10 by applying an impact to silicon ingot 10 in which ion-implanted layer 45 is formed to obtain silicon substrate 50 (refer to FIG. 7E).

FIGS. 8A to 8F show flow diagrams of a third method of manufacturing the silicon substrate having the textured surface related to Embodiment 2. In the third manufacturing method, process of forming an ion-implanted layer, which corresponds to the process D in the first manufacturing method, is performed before the process C of forming the PN junction. That is, the third manufacturing method includes a process A of preparing silicon ingot 10 (refer to FIG. 8A), a process B of forming a texture in surface 11 of silicon ingot 10 to convert surface 11 into textured surface 11' (refer to FIG. 8B), a process D" of implanting ions 40 from textured surface 11' to form ion-implanted layer 45 (refer to FIG. 8C), a process C of implanting dopant 30 to textured surface 11' to form PN junction 35 (refer to FIG. 8D), and a process E of dividing silicon ingot 10 by applying an impact to silicon ingot 10 in which ion-implanted layer 45 is formed to obtain silicon substrate 50 (refer to FIG. 8E).

Experimental Example of Embodiment 2

An experimental example in which a fine texture is formed in the surface of the silicon ingot having the substrate surface orientation (111) will be described.

Texture-forming apparatus 100 shown in FIGS. 4A and 4B was prepared, in addition, silicon ingot 110 having the substrate surface orientation (111) was placed on stage 150 of texture-forming apparatus 100 shown in FIGS. 4A and 4B. A distance between nozzle 130 and silicon ingot 110 was set to 10 mm. An area of a substrate surface of silicon substrate 110 was 125 mm×125 mm. A temperature of stage 150 was set to 25° C. A pressure inside decompression chamber 120 was adjusted to 30 KPa, and then the etching gas supplied from nozzle 130 was blown to the entirety of the surface of silicon ingot 110 for 3 minutes. A composition of the blown etching gas was set to "$ClF_3/O_2/N_2$=50 to 1,000 cc/2,000 cc/2,000 to 5,000 cc."

Similar to the example of Embodiment 1 as shown in FIGS. 5A to 5C, protrusions having a triangular pyramid shape were densely formed in the textured surface of the silicon ingot that was obtained. In addition, the height of each of protrusion was 100 nm to 200 nm.

As described above, according to the method of the present invention, since the fine texture may be formed, even in a silicon substrate having a thickness of 50 μm or less, the mechanical strength thereof is maintained, and thus this silicon substrate may be used as a silicon substrate for a solar cell.

Embodiment 3

FIGS. 9A to 9F show flow diagrams of a first method of manufacturing a silicon substrate having a textured surface related to Embodiment 3. The first manufacturing method as shown in FIGS. 9A to 9F includes a process A of preparing silicon ingot 10 (refer to FIG. 9A), a process B of forming a texture in surface 11 of silicon ingot 10 to convert surface 11 into textured surface 11' (refer to FIG. 9B), a process C of forming a hole 15 in textured surface 11' (refer to FIG. 9C), a process D of implanting dopant 30 to textured surface 11' in which hole 15 is formed to form PN junction 35 (refer to FIG. 9D), a process E of implanting ions 40 from textured surface 11' to form ion-implanted layer 45 (refer to FIG. 9E), and a process F of dividing silicon ingot 10 by applying an impact to silicon ingot 10 in which ion-implanted layer 45 is formed to obtain silicon substrate 50 (refer to FIG. 9F). Hereinafter, each process will be described.

With Respect to Process A (Process of Preparing Silicon Ingot)

Figure 9A:
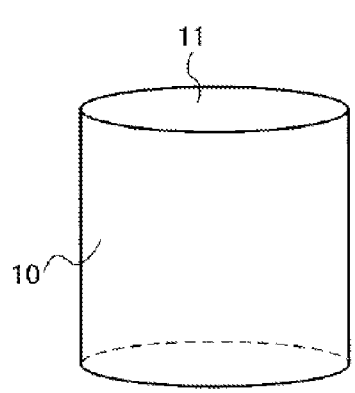
FIG. 9A is a flow diagram illustrating a first manufacturing example of a silicon substrate related to Embodiment 3.

As shown in FIG. 9A, silicon ingot 10 is prepared. Silicon ingot 10 that is prepared in the process A is a single crystal silicon ingot having substrate surface orientation (111). One of characteristics of the method of manufacturing the silicon ingot of the present invention is that a texture is formed in a surface of the silicon ingot having the substrate surface orientation (111). According to a wet etching method using an alkali solution, which is a general texture-forming method in the related art, a texture may be formed in the surface of the silicon ingot, which has the substrate surface orientation (100). However, the texture is not formed in a surface of the silicon ingot, which has substrate surface orientation (111), and the surface of the silicon ingot is etched in an isotropic manner. Conversely, in the present invention, the texture may be formed in a single crystal silicon ingot having the substrate surface orientation (111).

In addition, it is preferable that the silicon ingot be p-type doped or n-type doped. This is because that when the silicon ingot is doped in advance, it is easy to form a PN junction in the process C to be described later.

With Respect to Process B (Process of Forming Textured Surface)

Figure 9B:
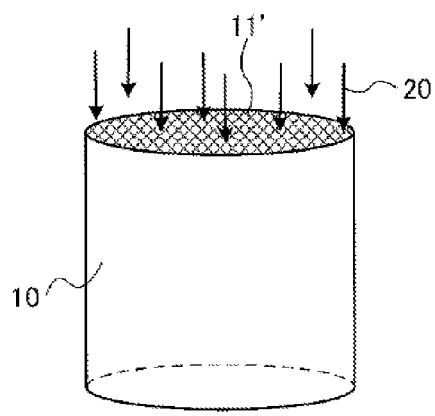
FIG. 9B is a flow diagram illustrating the first manufacturing example of the silicon substrate related to Embodiment 3.

As shown in FIG. 9B, a texture is formed in surface 11 of silicon ingot 10 to form textured surface 11'. The texture may be formed in the entirety of surface 11 of the silicon ingot, or the texture may be formed at a part thereof. The formation of the texture is preferably performed by gas etching (dry etching) in which etching gas 20 is blown. Since the thickness of the silicon substrate that is manufactured by the present invention is thin (for example, 50 μm or less), it is necessary to make the size of the texture (the height of the protrusion of irregularities) small. The small size of the texture represents that for example, the height of the protrusion is within a range of 100 nm to 1,500 nm, and preferably 100 nm to 1,000 nm.

According to wet etching using an alkali solution or reactive ion etching using plasma, which is a general method of forming a texture in the related art, the size of the formed texture becomes too large (for example, the height of the protrusion of the irregularities becomes approximately 10 μm), and thus it is difficult to obtain a thin silicon substrate. The etching gas may be the same as Embodiment 1.

During the etching in the process B, it is important to maintain a temperature of the silicon ingot at a low temperature. It is preferable that the temperature of silicon ingot be maintained at 130° C. or lower, more preferably 100° C. or lower, and still more preferably 80° C. or lower. It is preferable to maintain a temperature of a stage, on which the silicon ingot is placed, at approximately room temperature (25° C.) so as to maintain the temperature of silicon ingot at a low temperature.

The process B may include a step of blowing the cooling gas to the surface of the silicon ingot. Similar to the above-described inert gas, the cooling gas represents a nitrogen gas, argon, helium, or the like. When the cooling gas is blown to the surface of the silicon ingot that generates heat due to the reaction with the etching gas, the silicon ingot that generates heat may be cooled.

In the process B, a step of blowing the etching gas to the silicon ingot and a step of blowing the cooling gas to the silicon ingot may be alternately repeated. The temperature of the silicon ingot is maintained at a low temperature by controlling a process time of the step of blowing the etching gas to the silicon ingot. Although not particularly limited, the process time may be 1 minute to 10 minutes. After the step of blowing the etching gas to the silicon ingot, the cooling gas may be blown to lower the temperature of the silicon ingot, and then the etching gas may be blown again to the silicon ingot.

After textured surface 11' having a desired texture (refer to FIGS. 1B, 2C, and 3B) is formed in the surface of the silicon ingot by the etching gas, it is preferable to remove the etching gas or decomposed product thereof that remains in the silicon ingot. For example, a remaining fluorine component may be removed by placing the silicon ingot under a hydrogen gas atmosphere.

With Respect to Process C (Process of Forming Hole)

Figure 9C:
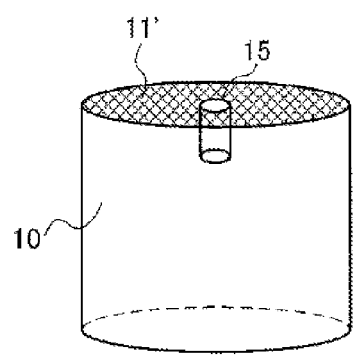
FIG. 9C is a flow diagram illustrating the first manufacturing example of the silicon substrate related to Embodiment 3.

As shown in FIG. 9C, hole 15 is formed in texture surface 11' of silicon ingot 10. Although not particularly limited, it is preferable that the diameter of hole 15 be larger than an interconnection width of a bus bar electrode (disposed on a textured surface) while being used for a solar cell. Commonly, the interconnection width of the bus bar electrode is approximately 1 mm. In addition, the depth of hole 15 may be larger than the thickness of silicon substrate 50 to be manufactured. For example, when the thickness of silicon substrate 50 to be manufactured is 20 μm, the depth of hole 15 may be 20 μm or more. A shape of hole 15 is not particularly limited, and may be an arbitrary shape, for example, a cylindrical shape, a conical shape, a prism shape, a pyramid shape, or the like.

The formation of hole 15 may be performed, for example, by etching using an alkali solution or by irradiating textured surface 11' with laser. However, it is preferable to form hole 15 by irradiation of laser.

In a case of forming hole 15 by etching using an alkali solution, for example, 1) textured surface 11' is covered with a mask (for example, a silicon oxide film), 2) the mask of a portion at which the hole is to be formed is removed to open a window, 3) a hole is formed in the silicon ingot at the window portion by the alkali solution, and 4) the mask is removed. In the etching using the alkali solution, a cleaning process using hydrogen fluoride, a heat treatment process, and the like are necessary as a post treatment. Therefore, in this process, the surface of the silicon substrate may be contaminated, and there is a disadvantage in a cost aspect.

On the other hand, the formation of hole 15 by the irradiation of laser may be performed by a dry process, and thus contamination of the silicon substrate is suppressed. Although conditions in the case of forming hole 15 by irradiation of laser are not particularly limited, laser light having a pulse width of a femtosecond or picosecond may be emitted using YAG laser or the like. Particularly, during the formation of hole 15, in a case where it is desired to suppress a silicon waste due to ablation, a plasma-assisted ablation method may be adapted.

With Respect to Process D (Process of Forming PN Junction)

Figure 9D:
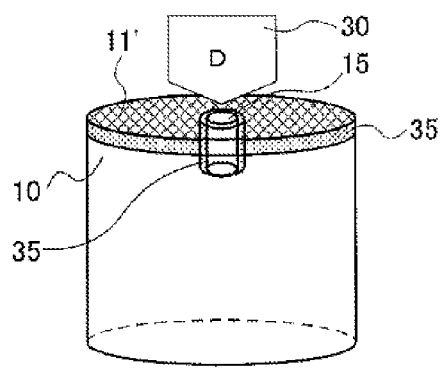
FIG. 9D is a flow diagram illustrating the first manufacturing example of the silicon substrate related to Embodiment 3.

As shown in FIG. 9D, dopant 30 is implanted to silicon ingot 10 through textured surface 11' in which hole 15 is formed and an inner wall surface of hole 15. In a case where silicon ingot 10 is P-type doped, PN junction 35 may be formed by subjecting a surface layer of textured surface 11' and a inner wall surface layer of hole 15 to N-type doping to form an emitter layer. In a case where silicon ingot 10 is N-type doped, PN junction 35 may be formed by subjecting the surface layer of textured surface 11' and the inner wall surface layer of hole 15 to P-type doping to form the emitter layer. It is preferable that PN junction 35 be formed in a region ranging from textured surface 11' and the inner wall surface of hole 15 to a depth of 0.01 μm to 0.1 μm, and for example, in a region ranging from textured surface 11' and the inner wall surface of hole 15 to a depth of approximately 0.05 μm.

The doping of the surface layer of textured surface 11' and the inner wall surface layer of the hole 15 may be realized using a method in which a dopant-containing gas is vapor-phase-diffused, a method in which a dopant-containing solution is applied to textured surface 11' and then the dopant is thermally diffused, or a method in which the textured surface 11' is irradiated with atmospheric-pressure plasma under a dopant-containing atmosphere. For example, in a case where silicon ingot 10 is p-type doped, 1) the silicon ingot is heated in a phosphorus oxychloride gas and phosphorous is vapor-phase-diffused to the surface layer of textured surface 11' and the inner wall surface layer of hole 15, or 2) the surface layer of textured surface 11' and the inner wall surface layer of hole 15 are irradiated with atmospheric-pressure plasma under a phosphorous-containing atmosphere. After the diffusion of the dopant, annealing (for example, heat treatment) may be performed for activation.

With Respect to Process E (Process of Forming Ion-Implanted Layer)

Figure 9E:
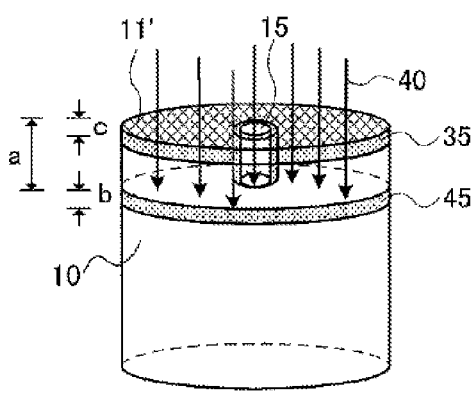
FIG. 9E is a flow diagram illustrating the first manufacturing example of the silicon substrate related to Embodiment 3.
Figure 10A:
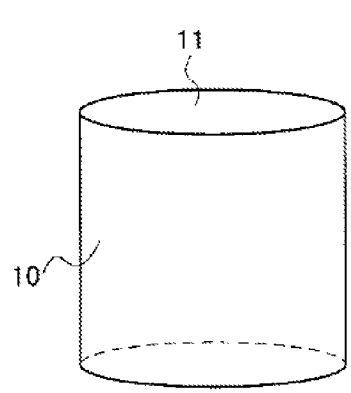
FIG. 10A is a flow diagram illustrating a second manufacturing example of the silicon substrate related to Embodiment 3.
Figure 10B:
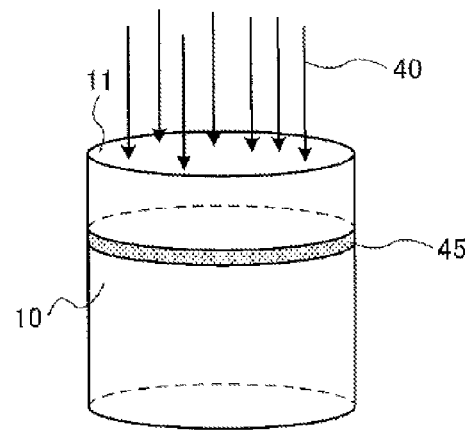
FIG. 10B is a flow diagram illustrating the second manufacturing example of the silicon substrate related to Embodiment 3.
Figure 11A:
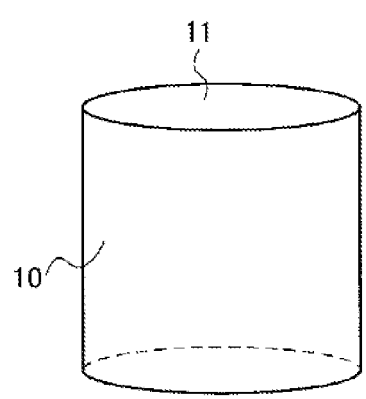
FIG. 11A is a flow diagram illustrating a third manufacturing example of the silicon substrate related to Embodiment 3.
Figure 11B:
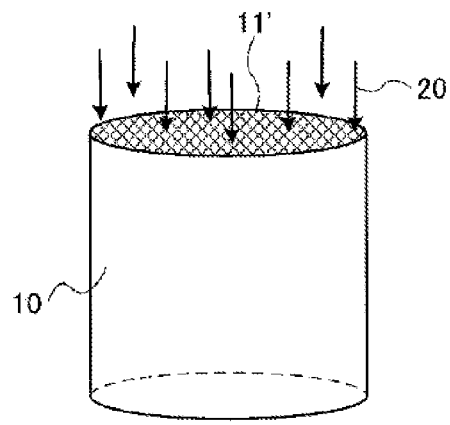
FIG. 11B is a flow diagram illustrating the third manufacturing example of the silicon substrate related to Embodiment 3.
Figure 11C:
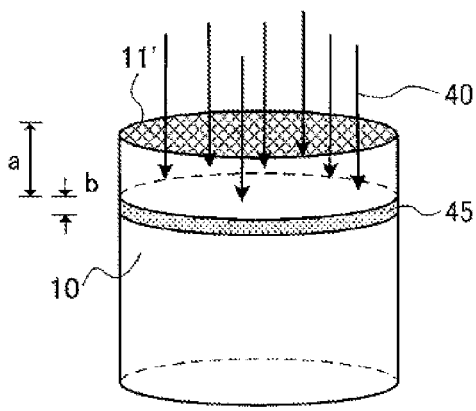
FIG. 11C is a flow diagram illustrating the third manufacturing example of the silicon substrate related to Embodiment 3.
Figure 11D:
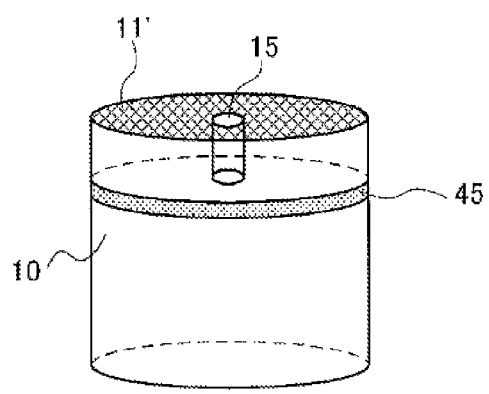
FIG. 11D is a flow diagram illustrating the third manufacturing example of the silicon substrate related to Embodiment 3.
Figure 11E:
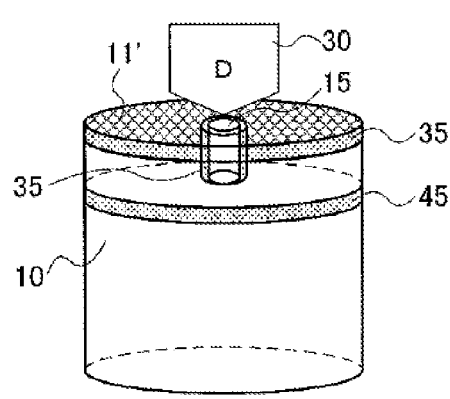
FIG. 11E is a flow diagram illustrating the third manufacturing example of the silicon substrate related to Embodiment 3.

As shown in FIG. 9E, ions 40 are implanted to silicon ingot 10 from textured surface 11' to form ion-implanted layer 45. In addition, in the manufacturing method related to Embodiment 3, the process (E process) of forming ion-implanted layer 45 is performed after forming PN junction 35. However, the process of forming ion-implanted layer 45 is not particularly limited, and may be performed before or after another process. For example, the process may be performed before forming the texture as a process E' (refer to FIG. 10B), or may be performed after forming the texture and before the forming hole 15 as a process E" (refer to FIG. 11C). That is, when performing the process E (process E' and process E"), the surface of silicon ingot 10 can be textured surface 11' (refer to FIGS. 9D and 11C) or non-textured surface 11 (refer to FIG. 10B), as long as ions 40 can be implanted to silicon ingot 10 through the surface (111 plane) of silicon ingot 10.

Examples of ions 40 that are implanted include hydrogen ions (protons), nitrogen ions, rare gas (argon or the like) ions, and the like. Implanted ions are made to be present in a layered region of the silicon ingot at "constant depth a" from the substrate surface to form ion-implanted layer 45. The "constant depth a" represents a depth of 50 μm or less, and preferably 20 μm or less. It is possible to adjust the thickness of manufactured silicon substrate 50 by adjusting the depth. In addition, the "constant depth a" has to be smaller than the depth of hole 15. This is because a penetration slot (through-hole) is provided in the silicon substrate to be manufactured.

In the process E (process E' and process E"), acceleration energy or a dose amount of the ions to be implanted is adjusted in order to form ion-implanted layer 45 in the layered region of silicon ingot at the constant depth a from the substrate surface of the silicon ingot. Although not particularly limited, the thickness b of ion-implanted layer 45 itself may be set to approximately 0.7 μm.

With Respect to Process F (Process of Dividing Silicon Ingot)

Figure 9F:
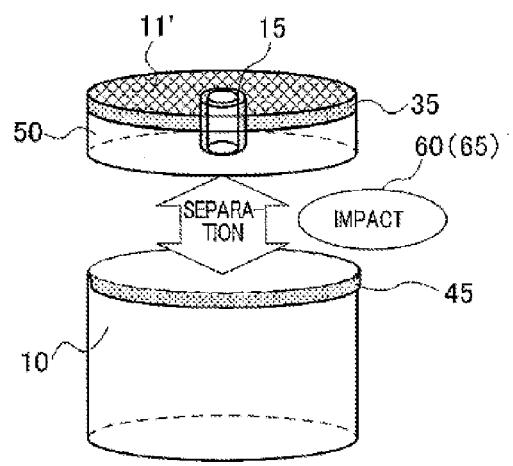
FIG. 9F is a diagram illustrating a process of obtaining a solar cell.

As shown in FIG. 9F, an impact is applied to silicon ingot 10 in which on-implanted layer 45 is formed. Means for applying an impact may be laser irradiation or heating treatment. The heating represents heating, for example, at 500° C. Furthermore, the impact may be applied to the silicon ingot by irradiation of atmospheric-pressure plasma 60. There is an advantage that a defect, which may occur in silicon ingot 10 due to ions 40 that are in planted in the process D, may be repaired by the irradiation of atmospheric-pressure plasma 50 instead of laser irradiation.

Furthermore, in the process F, after the irradiation of atmospheric-pressure plasma 60, irradiation of dry ultrasonic wave 65 may be further performed so as to apply an impact to silicon ingot. The irradiation of dry ultrasonic wave 65 has an advantage that a special facility is not necessary and a process cost is reduced.

Figure 10C:
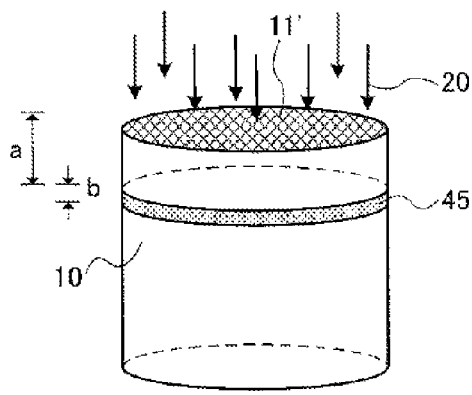
FIG. 10C is a flow diagram illustrating the second manufacturing example of the silicon substrate related to Embodiment 3.
Figure 10D:
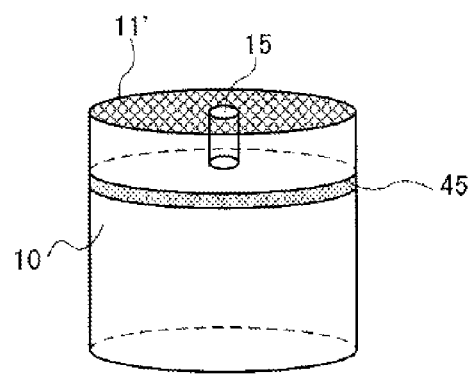
FIG. 10D is a flow diagram illustrating the second manufacturing example of the silicon substrate related to Embodiment 3.
Figure 10E:
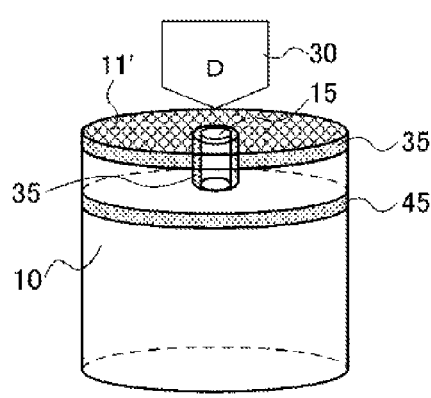
FIG. 10E is a flow diagram illustrating the second manufacturing example of the silicon substrate related to Embodiment 3.
Figure 10F:
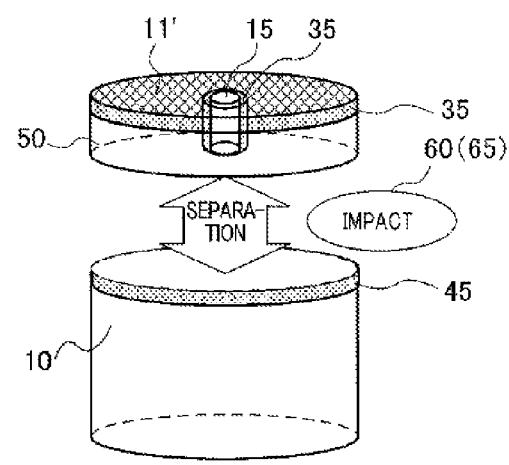
FIG. 10F is a diagram illustrating a process of obtaining a solar cell.
Figure 11F:
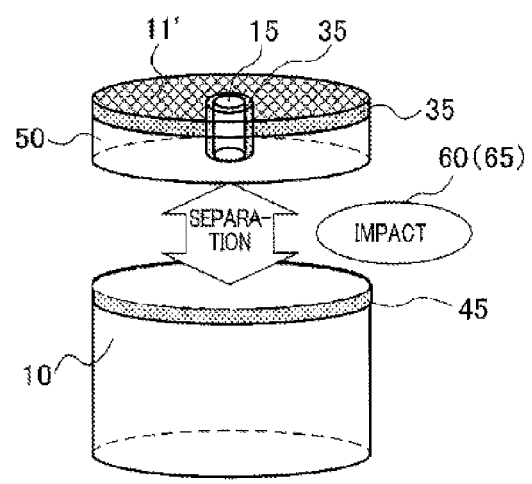
FIG. 11F is a flow diagram illustrating the third manufacturing example of the silicon substrate related to Embodiment 3.

Silicon ingot to which an impact is applied in the process F is divided at ion-implanted layer 45 set as a boundary (refer to FIGS. 9F, 10F, and 11F). As a result, silicon substrate 50, which has textured surface 11', a thickness of 50 μm or less, and substrate surface orientation (111), may be obtained in addition, penetration slot (through-hole) 15 is formed in silicon substrate 50.

Silicon substrate 50 manufactured by the present invention is provided with the texture formed in the surface thereof. The substrate surface in which the texture is formed is referred to as the textured surface.

Solar Cell

Figure 12:
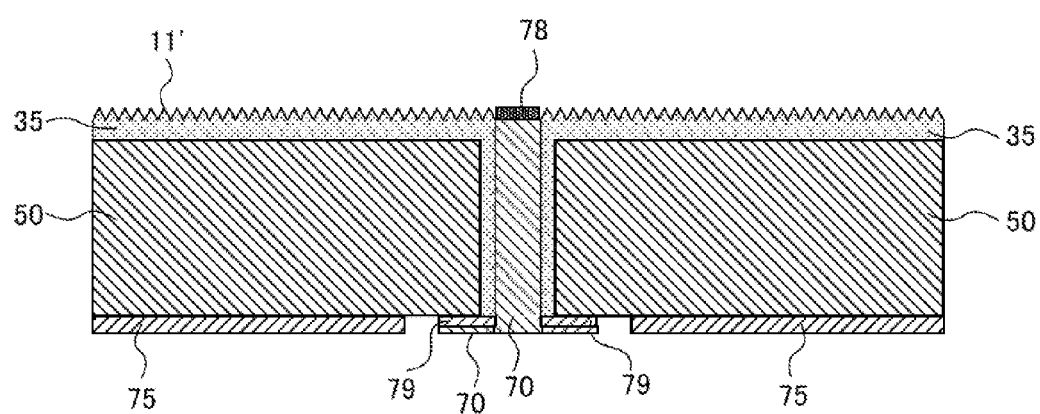
FIG. 12 is a diagram illustrating an example of a solar cell of a back contact cell type including the silicon substrate related to Embodiment 3.

It is preferable that silicon substrate 50 be used as a silicon substrate for as solar cell, and more preferably a back contact cell type silicon substrate. An example of a back contact cell type solar cell, which includes silicon substrate 50, is shown in FIG. 12. FIG. 12 shows a cross-section through which through-hole 15 (refer to FIG. 11F and the like) of silicon substrate 50 penetrates. The solar cell shown in FIG. 12 includes 1) electrode 70 that is filled inside through-hole 15, and 2) electrode 75 that is formed on a rear surface of textured surface 11' of silicon substrate 50. Electrode 70 is connected to PN conjunction 35. Electrode 70 may be formed on the rear surface of textured surface 11' of silicon substrate 50 as well as the inside of through-hole 15. In this case, insulating film 79 is interposed between the rear surface of textured surface 11' and electrode 70. In addition, electrode 70 is electrically connected to bus bar electrode 78 that is arranged on textured surface 11' of the silicon substrate. The bus bar electrode is connected to a finger electrode (not shown) or the like, and collects electricity that is generated by the solar cell. Formation of a metallic film that becomes an electrode may be performed, for example, by a deposition method. For example, electrode 70 is silver, and electrode 75 is an aluminum deposited film.

Furthermore, it is preferable that an anti-reflection layer (not shown) be laminated on textured surface 11' of silicon substrate 50. This is because the anti-reflection layer may further decrease a reflectance on the textured surface, thereby improving a photoelectric conversion rate of the solar cell.

Examples of the anti-reflection layer include a silicon nitride film, a titanium oxide film, and the like.

Hereinbefore, Embodiment 3 has been described, but Embodiment 3 is not limited to the above-described content, and various modification examples may be considered. For example, the following second and third manufacturing methods may be considered. FIGS. 10A to 10F show flow diagrams of a second method of manufacturing the silicon substrate having the textured surface related to Embodiment 3. After forming PN junction 35 as shown in FIGS. 9B, 9C, and 9D, ion-implanted layer 45 is formed as shown in FIGS. 9D and 9E. However, as shown in FIGS. 10B, 10C, and 10D, PN junction 35 may be formed after forming ion-implanted layer 45. That is, the second manufacturing method includes a process A of preparing silicon ingot 10 (refer to FIG. 10A), a process E' of implanting ions 40 from non-textured surface 11 of silicon ingot 10 to form ion-implanted layer 45 (refer to FIG. 10B), a process B of forming a texture in non-textured surface 11 of silicon ingot 10 to convert surface 11 into textured surface 11' (refer to FIG. 10C), a process C of forming hole 15 in textured surface 11' (refer to FIG. 10D), a process D of implanting dopant 30 to textured surface 11' in which hole 15 is formed to form PN junction 35 (refer to FIG. 10E), and a process F of dividing silicon ingot 10 by applying an impact to silicon ingot 10 in which ion-implanted layer 45 is formed to obtain silicon substrate 50 (refer to FIG. 10F).

FIGS. 11A to 11F show flow diagrams of a third method of manufacturing the silicon substrate having the textured surface related to Embodiment 3. In the third manufacturing method, a process of forming the ion-implanted layer, which corresponds to the process E in the first manufacturing method, is performed before the process C (the process of forming the hole). That is the third manufacturing method includes a process A of preparing silicon ingot 10 (refer to FIG. 11A), a process B of forming a texture in surface 11 of silicon ingot 10 to convert surface 11 into textured surface 11' (refer to FIG. 11B), a process E" of implanting ions 40 from textured surface 11' to form ion-implanted layer 45 (refer to FIG. 11C), a process C of forming hole 15 in textured surface 11' (refer to FIG. 11D), a process D of implanting dopant 30 to textured surface 11' in which hole 15 is formed to form PN junction 35 (refer to FIG. 11E), and a process F of dividing silicon ingot 10 by applying an impact to silicon ingot 10 in which ion-implanted layer 45 is formed to obtain silicon substrate 50 (refer to FIG. 11F).

Experimental Example of Embodiment 3

An experimental example in which a fine texture is formed in the surface of the silicon ingot having the substrate surface orientation (111) will be described.

Texture-forming apparatus 100 shown in FIGS. 4A and 4B was prepared. In addition, Silicon ingot 110 having the substrate surface orientation (111) was placed on stage 150 of texture-forming apparatus 100 shown in FIGS. 4A and 4B. A distance between nozzle 130 and silicon ingot 110 was set to 10 mm. An area of a substrate surface of silicon substrate 110 was 125 mm×125 mm. A temperature of stage 150 was set to 25° C. A pressure inside decompression chamber 120 was adjusted to 30 KPa, and then the etching gas supplied, through nozzle 130 was blown to the entirety of the surface of silicon ingot 110 for 3 minutes. A composition of the blown etching gas was set to "$ClF_3O_2/N_2$=50 to 1,000 cc/2000 cc/2,000 to 5,000 cc."

Similar to the example of Embodiment 1 as shown in FIGS. 5A to 5C, protrusions having a triangular pyramid shape were densely formed in the obtained textured surface of silicon ingot 110. In addition, the height of each of protrusion was 100 nm to 200 nm.

As described above, according to the method of the present invention, since the fine texture may be formed, even in a silicon substrate having a thickness of 50 μm or less and a through-hole, the mechanical strength thereof is maintained, and thus this silicon substrate may be used as a silicon substrate for a solar cell.

The present application claims priority from Japanese Patent Application No. 2011-91374 (filed on Apr. 15, 2011), Japanese Patent Application No. 2011-91382 (filed on Apr. 15, 2011), and Japanese Patent Application No. 2011-91386 (filed on Apr. 15, 2011), which are previously filed by the present applicant, the disclosure of which is incorporated herein by reference.

INDUSTRIAL APPLICABILITY

The silicon substrate of the present invention is particularly suitable for use as a silicon substrate for a solar cell by setting the textured surface as a light-receiving surface. In addition, material efficiency of silicon in the solar cell may be significantly increased.

REFERENCE SIGNS LIST

10 Silicon ingot
11 Surface of silicon ingot
11' Textured surface
15 (Through) Hall
20 Etching gas
30 Dopant
35 PN junction
40 Ion
45 Ion-implanted layer
60 Atmospheric-pressure plasma
65: Dry ultrasonic wave
50 Silicon substrate
70 Front-surface electrode
75 Rear-surface electrode
100 Texture-forming apparatus
110 Silicon ingot (silicon substrate)
120 Decompression chamber
130 Etching gas ejecting nozzle
131 Etching gas supplying pipe
140 Cooling gas ejecting nozzle
141 Cooling gas supplying pipe
150 Stage

The invention claimed is:

1. A method of manufacturing a silicon substrate for a solar cell, comprising:
   a process A of preparing a silicon ingot having a substrate surface orientation (111);
   a process B of blowing an etching gas including a fluorine-containing gas to the substrate surface of the silicon ingot to form a textured surface;
   a process C of implanting a dopant to the textured surface to form a PN junction in a surface layer of the silicon ingot;
   a process D of implanting ions through the textured surface into the silicon ingot to form an ion-implanted layer; and
   a process E of dividing the silicon ingot at the ion-implanted layer by applying an impact to the silicon ingot in which the ion-implanted layer is formed to obtain a silicon substrate having a thickness of 50 μm or less.

2. A method of manufacturing a silicon substrate for a solar cell, comprising:
- a process A of preparing a silicon ingot having a substrate surface orientation (111);
- a process D' of implanting ions through the substrate surface into the silicon ingot to form an ion-implanted layer;
- a process B of blowing an etching gas including a fluorine-containing gas to the substrate surface of the silicon ingot to form a textured surface;
- a process C of implanting a dopant to the textured surface to form a PN junction in a surface layer of the silicon ingot; and
- a process E of dividing the silicon ingot at the ion-implanted layer by applying an impact to the silicon ingot in which the ion-implanted layer is formed to obtain a silicon substrate having a thickness of 50 μm or less.

3. A method of manufacturing a silicon substrate for a solar cell, comprising:
- a process A of preparing a silicon ingot having a substrate surface orientation (111);
- a process B of blowing an etching gas including a fluorine-containing gas to the substrate surface of the prepared silicon ingot to form a textured surface;
- a process D" of implanting ions through the textured surface into the silicon ingot to form an ion-implanted layer;
- a process C of implanting a dopant to the textured surface to form a PN junction in a surface layer of the silicon ingot;
- a process E of dividing the silicon ingot at the ion-implanted layer by applying an impact to the silicon ingot in which the ion-implanted layer is formed to obtain a silicon substrate having a thickness of 50 μm or less.

4. The method according to claim 1,
wherein the fluorine-containing gas includes one or more gases selected from a group consisting of $ClF_3$, $XeF_2$, $BrF_3$, $BrF_5$, and $NF_3$.

5. The method according to claim 2,
wherein the fluorine-containing gas includes one or more gases selected from a group consisting of $ClF_3$, $XeF_2$, $BrF_3$, $BrF_5$, and $NF_3$.

6. The method according to claim 3,
wherein the fluorine-containing gas includes one or more gases selected from a group consisting of $ClF_3$, $XeF_2$, $BrF_3$, $BrF_5$, and $NF_3$.

7. The method according to claim 1,
wherein the etching gas further includes a gas that contains an oxygen atom in a molecule.

8. The method according to claim 2,
wherein the etching gas further includes a gas that contains an oxygen atom in a molecule.

9. The method according to claim 3,
wherein the etching gas further includes a gas that contains an oxygen atom in a molecule.

10. The method according to claim 1,
wherein etching of the silicon substrate in the process B is performed under a reduced-pressure atmosphere.

11. The method according to claim 2,
wherein etching of the silicon substrate in the process B is performed under a reduced-pressure atmosphere.

12. The method according to claim 3,
wherein etching of the silicon substrate in the process B is performed under a reduced-pressure atmosphere.

13. The method according to claim 1,
wherein a plurality of pyramid-shaped protrusions are formed in the textured surface, and a height of the protrusions is within a range of 100 nm to 1,500 nm.

14. The method according to claim 2,
wherein a plurality of pyramid-shaped protrusions are formed in the textured surface, and a height of the protrusions is within a range of 100 nm to 1,500 nm.

15. The method according to claim 3,
wherein a plurality of pyramid-shaped protrusions are formed in the textured surface, and a height of the protrusions is within a range of 100 nm to 1,500 nm.

16. A method of manufacturing a silicon substrate for a solar cell, comprising:
- a process A of preparing a silicon ingot having a substrate surface orientation (111);
- a process B of blowing an etching gas including a fluorine-containing gas to the substrate surface of the silicon ingot to form a textured surface;
- a process C of irradiating the textured surface with a laser to form a hole therein;
- a process D of implanting a dopant to the textured surface to form a PN junction in a surface layer of the silicon ingot and an inner wall surface layer of the hole;
- a process E of implanting ions through the textured surface into the silicon ingot to form an ion-implanted layer; and
- a process F of dividing the silicon ingot at the ion-implanted layer by applying an impact to the silicon ingot in which the ion-implanted layer is formed to obtain a silicon substrate having a thickness of 50 μm or less.

17. A method of manufacturing a silicon substrate for a solar cell, comprising:
- a process A of preparing a silicon ingot having a substrate surface orientation (111);
- a process E' of implanting ions through the substrate surface into the silicon ingot to form an ion-implanted layer;
- a process B of blowing an etching gas including a fluorine-containing gas to the substrate surface of the silicon ingot to form a textured surface;
- a process C of irradiating the textured surface with a laser to form a hole therein;
- a process D of implanting a dopant to the textured surface to form a PN junction in a surface layer of the silicon ingot and an inner wall surface layer of the hole; and
- a process F of dividing the silicon ingot at the ion-implanted layer by applying an impact to the silicon ingot in which the ion-implanted layer is formed to obtain a silicon substrate having a thickness of 50 μm or less.

18. A method of manufacturing a silicon substrate for a solar cell, comprising:
- a process A of preparing a silicon ingot having a substrate surface orientation (111);
- a process B of blowing an etching gas including a fluorine-containing gas to the substrate surface of the silicon ingot to form a textured surface;
- a process E" of implanting ions through the textured surface into the silicon ingot to form an ion-implanted layer;
- a process C of irradiating the textured surface with a laser to form a hole therein;
- a process D of implanting a dopant to the textured surface to form a PN junction in a surface layer of the silicon ingot and an inner wall surface layer of the hole; and
- a process F of dividing the silicon ingot at the ion-implanted layer by applying an impact to the silicon ingot in which the ion-implanted layer is formed to obtain a silicon substrate having a thickness of 50 μm or less.

19. The method according to claim 16,
wherein the fluorine-containing gas includes one or more gases selected from a group consisting of $ClF_3$, $XeF_2$, $BrF_3$, $BrF_5$, and $NF_3$.

20. The method according to claim 17,
wherein the fluorine-containing gas includes one or more gases selected from a group consisting of $ClF_3$, $XeF_2$, $BrF_3$, $BrF_5$, and $NF_3$.

21. The method according to claim 18,
wherein the fluorine-containing gas includes one or more gases selected from a group consisting of $ClF_3$, $XeF_2$, $BrF_3$, $BrF_5$, and $NF_3$.

22. The method according to claim 16,
wherein the etching gas further includes a gas that contains an oxygen atom in a molecule.

23. The method according to claim 17,
wherein the etching gas further includes a gas that contains an oxygen atom in a molecule.

24. The method according to claim 18,
wherein the etching gas further includes a gas that contains an oxygen atom in a molecule.

25. The method according to claim 16,
wherein etching of the silicon substrate in the process B is performed under a reduced-pressure atmosphere.

26. The method according to claim 17,
wherein etching of the silicon substrate in the process B is performed under a reduced-pressure atmosphere.

27. The method according to claim 18,
wherein etching of the silicon substrate in the process B is performed under a reduced-pressure atmosphere.

28. The method according to claim 16,
wherein a plurality of pyramid-shaped protrusions are formed in the textured surface, and a height of the protrusions is within a range of 100 nm to 1,500 nm.

29. The method according to claim 17,
wherein a plurality of pyramid-shaped protrusions are formed in the textured surface, and a height of the protrusions is within a range of 100 nm to 1,500 nm.

30. The method according to claim 18,
wherein a plurality of pyramid-shaped protrusions are formed in the textured surface, and a height of the protrusions is within a range of 100 nm to 1,500 nm.

* * * * *